US012640198B2

(12) United States Patent
Hwang

(10) Patent No.: US 12,640,198 B2
(45) Date of Patent: May 26, 2026

(54) SEMICONDUCTOR DEVICE

(71) Applicant: SAMSUNG ELECTRONICS CO., LTD., Suwon-si (KR)

(72) Inventor: Youngnam Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 112 days.

(21) Appl. No.: 18/821,016

(22) Filed: Aug. 30, 2024

(65) Prior Publication Data

US 2025/0299731 A1     Sep. 25, 2025

(30) Foreign Application Priority Data

Mar. 25, 2024     (KR) ........................ 10-2024-0040583

(51) Int. Cl.
| | |
|---|---|
| *G11C 11/54* | (2006.01) |
| *G11C 7/16* | (2006.01) |
| *G11C 11/22* | (2006.01) |
| *H10B 80/00* | (2023.01) |
| *H10W 90/00* | (2026.01) |

(52) U.S. Cl.
CPC .............. *G11C 11/54* (2013.01); *G11C 7/16* (2013.01); *G11C 11/223* (2013.01); *G11C 11/2257* (2013.01); *G11C 11/2273* (2013.01); *G11C 11/2275* (2013.01); *H10B 80/00* (2023.02); *H10W 90/00* (2026.01); *H10W 90/792* (2026.01)

(58) Field of Classification Search
CPC ................................ G11C 11/54; H10B 80/00

USPC .......................................................... 365/167
See application file for complete search history.

(56) References Cited

U.S. PATENT DOCUMENTS

| | | | | |
|---|---|---|---|---|
| 10,643,119 | B2 * | 5/2020 | Chiu ..................... | G11C 13/003 |
| 11,087,208 | B2 * | 8/2021 | Yakopcic ............... | G06N 3/065 |
| 11,397,885 | B2 | 7/2022 | Hoang et al. | |
| 11,410,026 | B2 * | 8/2022 | Cho ....................... | G06N 3/063 |
| 11,531,871 | B2 | 12/2022 | Jang et al. | |
| 2023/0038384 | A1 * | 2/2023 | Hwang ................... | G06N 3/063 |
| 2023/0153589 | A1 | 5/2023 | Hwang | |
| 2023/0380176 | A1 | 11/2023 | Ha et al. | |

FOREIGN PATENT DOCUMENTS

| | | | |
|---|---|---|---|
| EP | | 4 181 025 A1 | 5/2023 |
| KR | | 10-2541000 B1 | 6/2023 |

* cited by examiner

*Primary Examiner* — Muna A Techane
(74) *Attorney, Agent, or Firm* — Sughrue Mion, PLLC

(57) ABSTRACT

A semiconductor device may include: a cell area in which a plurality of memory cells arranged in a first direction, a second direction and a third direction are disposed, the first direction and the second direction being parallel to an upper surface of a substrate and intersecting, and the third direction being perpendicular to the upper surface of the substrate; and a peripheral circuit area in which a word line driver connected to the plurality of memory cells through a plurality of word lines, a sense amplifier circuit connected to the plurality of memory cells through a plurality of bit lines, and a source line driver connected to the plurality of memory cells through a plurality of source lines, are disposed.

20 Claims, 22 Drawing Sheets

SEMICONDUCTOR DEVICE

CROSS-REFERENCE TO RELATED APPLICATION(S)

This application claims the benefit under 35 USC 119(a) of Korean Patent Application No. 10-2024-0040583 filed on Mar. 25, 2024 in the Korean Intellectual Property Office, the entire disclosure of which is incorporated herein by reference for all purposes.

BACKGROUND

1. Field

The present disclosure relates to a semiconductor device.

2. Description of Related Art

A neuromorphic device is a semiconductor device created by replicating an information processing method of the brain by manufacturing an artificial nervous system on the neuron level, and may implement deep learning neural networks, neuromorphic computing, and the like. A neuromorphic device may perform a Multiply and Accumulate (MAC) operation or the like, multiplying input data by a weight and adding up the multiplication results, and may include a plurality of memory cells storing the weight in data form to execute the operation. Various methods are being proposed to improve integration and reduce power consumption, while improving the performance of neuromorphic devices.

SUMMARY

Example embodiments provide a semiconductor device in which a weight corresponding to one layer of a neural network may be stored in memory cells disposed at the same height from an upper surface of a substrate in a semiconductor device storing weights included in the neural network, thereby improving integration and reducing power consumption.

According to one or more example embodiments, a semiconductor device may include: a cell area in which a plurality of memory cells arranged in a first direction, a second direction and a third direction are disposed, the first direction and the second direction being parallel to an upper surface of a substrate and intersecting, and the third direction being perpendicular to the upper surface of the substrate; and a peripheral circuit area in which a word line driver connected to the plurality of memory cells through a plurality of word lines, a sense amplifier circuit connected to the plurality of memory cells through a plurality of bit lines, and a source line driver connected to the plurality of memory cells through a plurality of source lines, are disposed. The peripheral circuit area may be configured to store weights corresponding to: one layer among a plurality of layers in a neural network, in a portion of memory cells disposed at a same height in the third direction among the plurality of memory cells, store weight data corresponding to one weight among the weights in two or more memory cells disposed at a same height in the third direction and aligned in the first direction or the second direction.

According to one or more example embodiments, a semiconductor device may include: a cell area in which a plurality of memory cells are arranged in a first direction, a second direction and a third direction, the first direction and the second direction being parallel to an upper surface of a substrate and intersecting and the third direction being perpendicular to the upper surface of the substrate, the plurality of memory cells may include a first active area and a second active area aligned in the first direction, a channel layer connected to the first active area and the second active area in the first direction, and a ferroelectric layer and a gate electrode layer surrounding the channel layer; and a peripheral circuit area in which a plurality of sense amplifiers are connected to the plurality of memory cells through a plurality of bit lines, a word line driver connected to the plurality of memory cells through a plurality of word lines, and a source line driver connected to the plurality of memory cells through a plurality of source lines are disposed. The peripheral circuit area may be configured to store weight data corresponding to one weight among weights in a neural network, in two or more memory cells aligned continuously in the first direction or the second direction and located on a same height in the third direction, as separate bits.

According to one or more example embodiments, a semiconductor device may include: a cell area may include a plurality of memory cells arranged in three dimensions on a substrate; and a peripheral circuit area configured to store weight data corresponding to weights in a neural network in the plurality of memory cells and execute an inference operation based on the neural network using the weight data stored in the plurality of memory cells. In the inference operation, the peripheral circuit area may be configured to simultaneously activate a portion of memory cells disposed at a same height from the substrate, among the plurality of memory cells, and deactivate remaining memory cells disposed at a different height from the portion of memory cells.

According to one or more example embodiments, a semiconductor device may include: a plurality of memory cells disposed in a three-dimensional grid such that rows of the memory cells extend in a first direction, columns of the memory cells extend in a second direction, and stacks of the memory cells extend in a third direction, the first direction and the second direction being parallel to an upper surface of a substrate and intersecting, and the third direction being perpendicular to the upper surface of the substrate; and a peripheral circuit may include a word line driver connected to the plurality of memory cells through a plurality of word lines, a sense amplifier circuit connected to the plurality of memory cells through a plurality of bit lines, and a source line driver connected to the plurality of memory cells through a plurality of source lines. The peripheral circuit may be configured to: store weights corresponding to one layer among a plurality of layers in a neural network, in a portion of memory cells disposed at a same height in the third direction among the plurality of memory cells; and store weight data corresponding to one weight among the weights in two or more memory cells disposed at a same height in the third direction and aligned in the first direction or the second direction.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
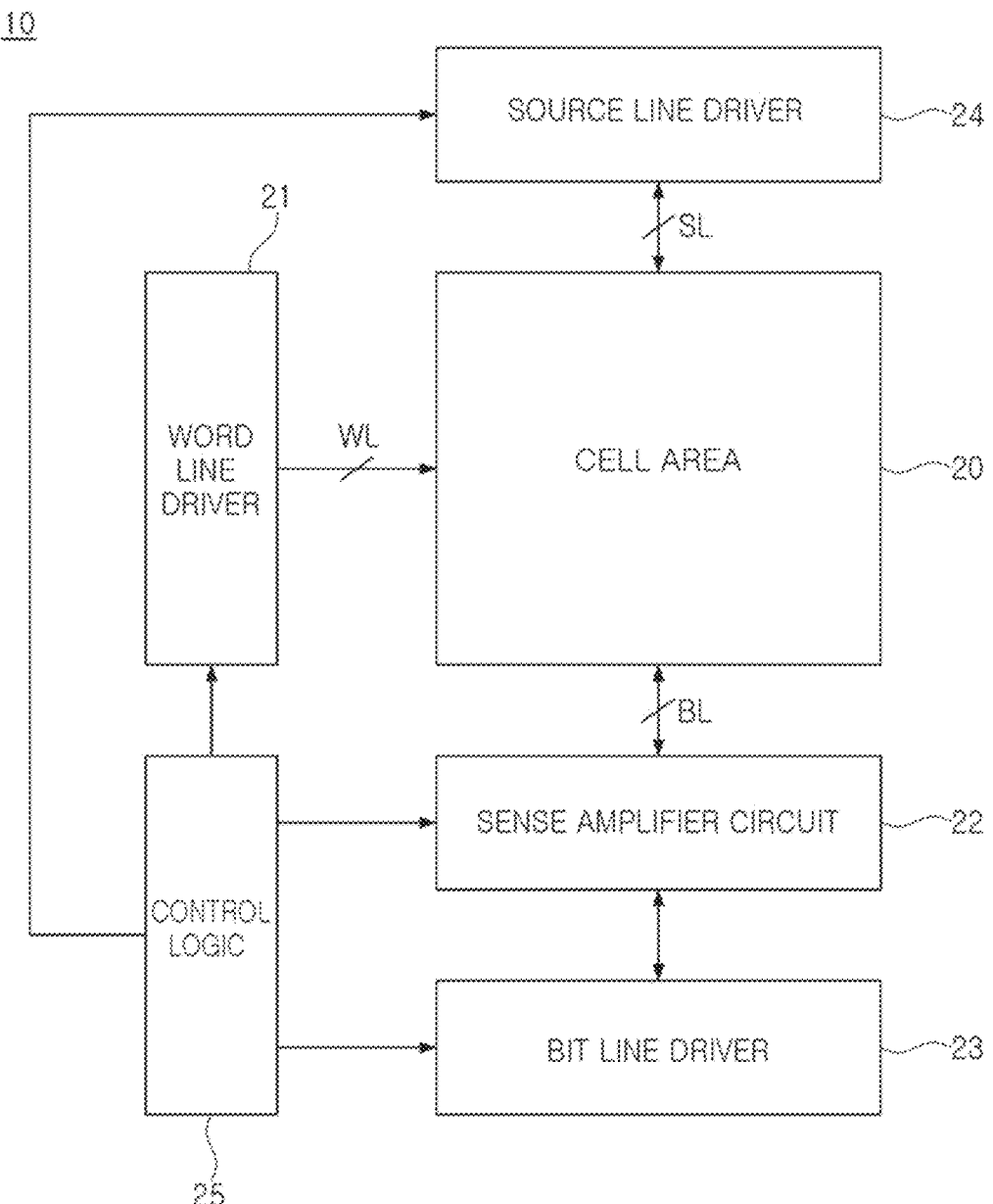
FIG. 1 is a schematic diagram of a semiconductor device according to example embodiments.
Figure 2:
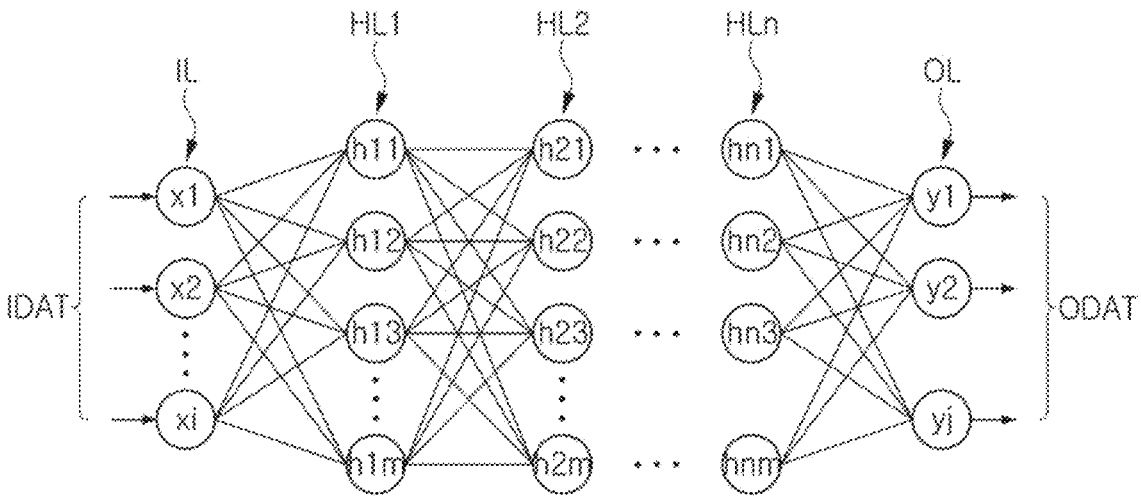
FIG. 2 is a diagram illustrating a neural network implemented with a semiconductor device according to example embodiments.

FIGS. 1 and 2 are schematic diagrams of a semiconductor device according to example embodiments.

Referring to FIG. 1, a semiconductor device 10 according to example embodiments may include a cell area 20, peripheral circuit areas 21 to 25, and the like. A plurality of memory cells are disposed in the cell area 20, and the plurality of memory cells may be connected to the word line driver 21 through a plurality of word lines WL and may be connected to the sense amplifier circuit 22 through a plurality of bit lines BL.

For example, the sense amplifier circuit 22 includes a plurality of sense amplifiers, and the plurality of sense amplifiers may respectively be connected to the plurality of bit lines BL. When a selected bit line is determined among the plurality of bit lines BL by the bit line driver 23, at least one sense amplifier connected to the selected bit line may be activated in the sense amplifier circuit 22. Additionally, the plurality of memory cells may be connected to the source line driver 24 through a plurality of source lines SL. The operations of the word line driver 21, the sense amplifier circuit 22, the bit line driver 23, and the source line driver 24 may be controlled by the control logic 25. Depending on example embodiments, the sense amplifier circuit 22 may be connected to the plurality of source lines SL rather than the plurality of bit lines BL.

Each of the plurality of memory cells may include at least one element. In example embodiments, each of the plurality of memory cells may include a first active area, a second active area, a channel layer between the first active area and the second active area, a ferroelectric layer and a gate electrode layer surrounding the channel layer, and the like. The ferroelectric layer includes a ferroelectric material, and the polarization direction and degree of polarization of the ferroelectric layer vary depending on the voltage input to the first active area, the second active area, and the gate electrode layer, and as a result, the threshold voltage of the memory cell may change. In example embodiments in which the memory cell includes a ferroelectric layer, data may be stored in the memory cell by changing the threshold voltage of the memory cell by adjusting the polarization direction, polarization degree of the ferroelectric layer and the like.

However, the structure of the memory cell may vary, depending on example embodiments. For example, a memory cell may include a switch element and a memory element with variable resistance characteristics. In this case, the gate of the switch element is connected to one of the plurality of word lines WL, and the switch element and the memory element may be connected in series and connected between one of the plurality of bit lines BL and one of the plurality of source lines SL. Therefore, data may be stored in the memory cell by increasing or decreasing the resistance of the memory element with the switch element turned on.

In the cell area 20, a plurality of memory cells may be arranged in a memory cell array. Two or more memory cells may be connected to each of the plurality of word lines WL, and two or more memory cells may be connected to each of the plurality of bit lines BL and the plurality of source lines SL. In the cell area 20, a plurality of memory cells may be arranged in three dimensions.

For example, each of the bit lines BL and the source lines SL extends in a first direction, parallel to the upper surface of the substrate and may be connected to some of the memory cells. Meanwhile, the plurality of word lines WL may respectively be connected to gate electrode layers extending in a second direction crossing the first direction. Accordingly, a plurality of memory cells may be disposed at positions where a plurality of word lines WL and a plurality of bit lines BL intersect. Meanwhile, the gate electrode layers are stacked in a third direction perpendicular to the upper surface of the substrate, and accordingly, at least two or more memory cells may be stacked in the third direction at each location where the plurality of word lines WL and the plurality of bit lines BL intersect. In other words, the plurality of memory cells may be disposed in a three-dimensional grid, such that rows of the memory cells extend in a first direction, columns of the memory cells extend in a second direction, and stacks of the memory cells extend in a third direction.

The control logic 25 may control the word line driver 21, the sense amplifier circuit 22, the bit line driver 23, the source line driver 24 and the like in response to commands received from an external memory controller. For example, voltage input by the word line driver 21 to each of the plurality of word lines WL, the voltage that the sense amplifier circuit 22 inputs to each of the plurality of bit lines BL, and the voltage that the source line driver 24 inputs to each of the plurality of source lines SL may vary by control logic 25, and accordingly, program operations, read operations, and the like may be executed.

The semiconductor device 10 described with reference to FIG. 1 may be applied, for example, to implement a neuromorphic device based on a neural network. Weights included in the neural network may be stored in the plurality of memory cells disposed in the cell area 20. For example, each of the weights may be converted into 2-bit or more data, and 2-bit or more data converted from one weight may be distributed and stored bit by bit (i.e. as separate bits) in two or more memory cells.

Figure 3:
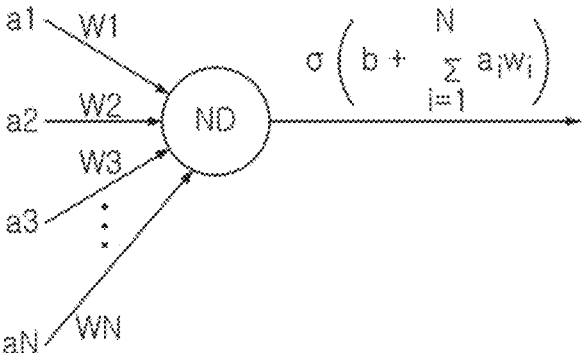
FIG. 3 is a diagram illustrating a neural network implemented with a semiconductor device according to example embodiments.

FIGS. 2 and 3 are diagrams illustrating a neural network implemented with a semiconductor device according to example embodiments.

As described above, a semiconductor device according to example embodiments may execute calculations necessary to implement a neural network. FIGS. 2 and 3 may be diagrams illustrating a neural network that may be supported by a semiconductor device according to example embodiments.

First, referring to FIG. 2, the network structure of a general neural network may include an input layer IL, a plurality of hidden layers HL1 to HLn, and an output layer OL. The input layer IL may include i (where i is a natural number) input nodes x1 to xi, and input data IDAT in the form of a vector with a length of i may be input to each input node.

The neural network includes n (where n is a natural number) hidden layers HL1 to HLn, and each of the hidden layers HL1 to HLn may include hidden nodes. For example, the first hidden layer HL1 includes m (where m is a natural number) hidden nodes h11 to h1*m*, and the nth hidden layer HLn may include m hidden nodes hn1 to hnm. In the example embodiment illustrated in FIG. 2, each of the hidden layers HL1 to HLn is illustrated as including the same number of hidden nodes, but is not necessarily limited to this form. For example, at least some of the hidden layers HL1 to HLn may include different numbers of hidden nodes.

In example embodiments, the output layer OL may include j output nodes y1 to yj corresponding to the class to be classified (where j is a natural number). For example, the output layer OL may output a result (for example, score or class score) for each class as output data ODAT with respect to the input data IDAT.

The neural network illustrated in FIG. 2 may include connections (branch) between nodes illustrated as straight lines between two nodes, and weights (weights) used in each connection. At this time, nodes included in one layer may not be connected to each other, and nodes included in different layers may be fully or partially connected.

Each node in FIG. 2 may receive the output of the previous node and perform calculations, and output the calculation results to the subsequent node. At this time, each node may calculate the value to be output by applying the input value to a specific function, for example, a non-linear function.

In general, the neural network structure is predetermined, and the weights according to the connections between nodes may be determined to appropriate values using a data set where the correct answer is already known. The data set used to determine the weights for which the correct answer is already known is called training data, and the process of determining the weights of a neural network using the training data may be defined as training.

FIG. 3 may be a diagram illustrating an example of an operation performed at one node ND among the nodes included in the neural network of FIG. 2. Referring to FIG. 3, when n inputs a1 to an are provided to one node ND, the node ND may multiply and sum the n inputs a1 to an and the n weights w1 to wn corresponding thereto, and add an offset b to the summed value. Additionally, the node ND may generate one output value (z) by applying the value reflecting the offset to a specific function (a).

When one of the layers included in the neural network according to the example embodiment illustrated in FIG. 2 includes m nodes ND illustrated in FIG. 3, the output values of one layer may be obtained as in [Equation 1] below.

$$Z = W * A \qquad \text{[Equation 1]}$$

In [Equation 1] above, W represents the weight corresponding to all connections included in the one layer, and may be expressed in m×n matrix form. A represents n inputs a1 to an received by the one layer, and may be implemented in the form of an n×1 matrix form. Z represents m outputs Z1 to Zm output from one layer, and may be expressed in m×1 matrix form.

Figure 4:
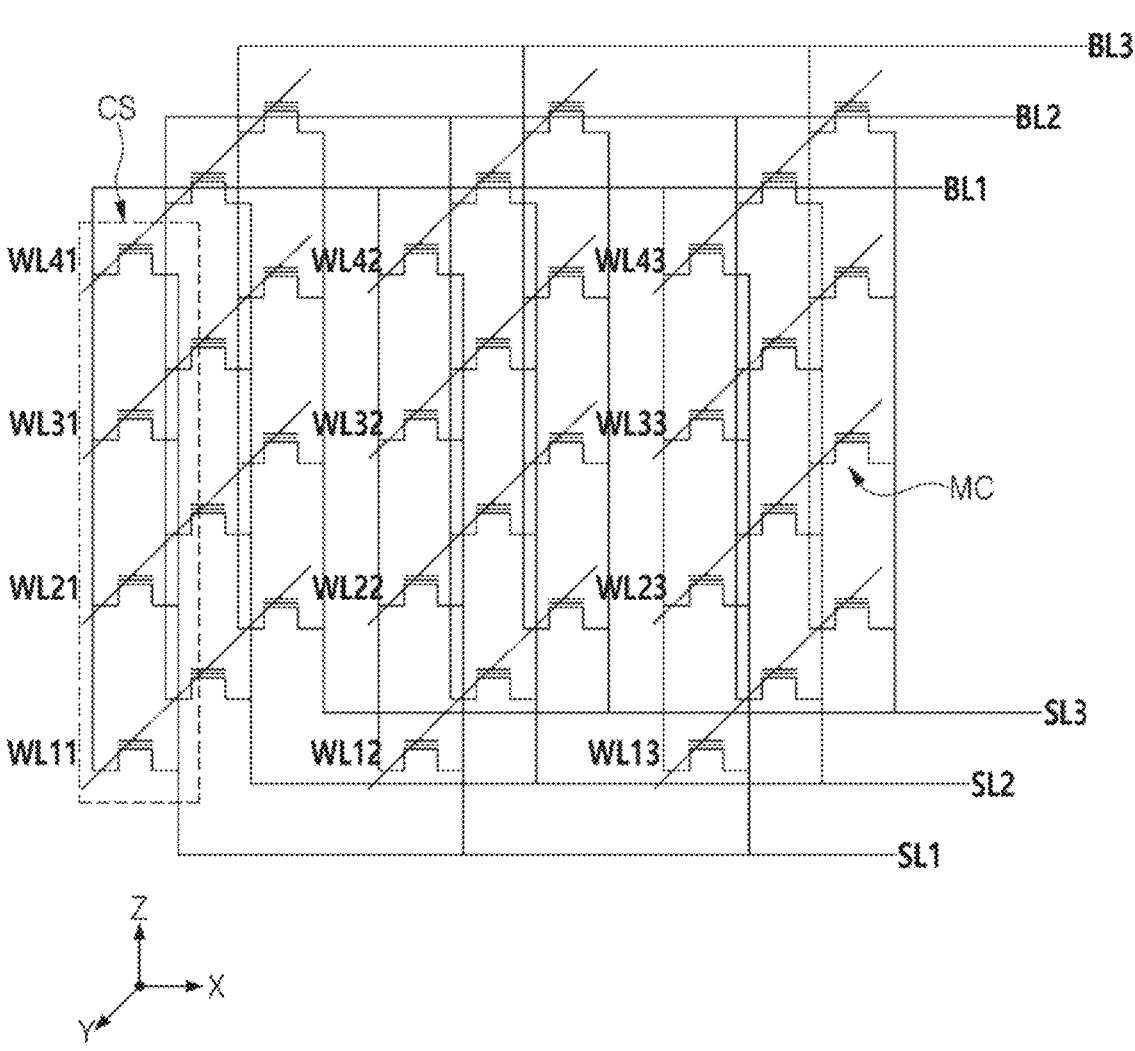
FIG. 4 is a diagram simply illustrating a memory cell array of a semiconductor device according to example embodiments.

FIG. 4 is a diagram simply illustrating the memory cell array of a semiconductor device according to example embodiments.

Referring to FIG. 4, the memory cell array 30 of a semiconductor device according to example embodiments may include a plurality of memory cells MC connected to a plurality of word lines WL11 to WL43, a plurality of bit lines BL1 to BL3, and a plurality of source lines SL1 to SL3. In an example embodiment illustrated in FIG. 4, each of the plurality of memory cells MC may be implemented as a single device in which a ferroelectric layer is disposed between a gate electrode layer and a channel layer. In each of the plurality of memory cells MC, the first active area is connected to one of the plurality of source lines SL1 to SL3, the second active area is connected to one of the plurality of bit lines BL1 to BL3, and the gate electrode layer may be connected to one of the plurality of word lines WL11 to WL43. However, depending on example embodiments, each of the plurality of memory cells MC may include two or more elements.

The bit lines BL1 to BL3 and the source lines SL1 to SL3 may extend in different directions from the word lines WL11 to WL43. For example, the plurality of bit lines BL1 to BL3 and the plurality of source lines SL1 to SL3 extend in the first direction (X-axis direction), and the plurality of word lines WL11 to WL43 may extend in the second direction (Y-axis direction). A plurality of memory cells MC are disposed at intersections of a plurality of bit lines BL1 to BL3 and a plurality of word lines WL11 to WL43, and two or more of the plurality of memory cells MC may be disposed in the same position in the first and second directions and may be arranged in the third direction (Z-axis direction).

For example, the third direction may be perpendicular to the upper surface of the substrate on which the plurality of memory cells MC are formed. Two or more memory cells MC arranged at the same position in the first and second directions and arranged in the third direction may be commonly connected to one of the plurality of bit lines BL1 to BL3 and one of the plurality of source lines SL1 to SL3, and may provide one cell string CS. In an example embodiment illustrated in FIG. 4, one cell string CS is illustrated to include four memory cells MC, but depending on example embodiments, the number of memory cells MC included in one cell string CS may vary. Meanwhile, two or more memory cells MC disposed at the same location in the first and third directions may be commonly connected to one of the plurality of word lines WL11 to WL43.

A semiconductor device including a memory cell array 30 as illustrated in FIG. 4 may support inference operations using a neural network, and the like. For example, when the training of the neural network as described above with reference to FIG. 2 is completed and the weights are determined, each of the weights may be converted into weight data of 2 bits or more and stored in the memory cells MC. In example embodiments, bits of weight data obtained by converting one weight may be stored in each memory cell MC, one bit at a time.

For example, bits of weight data corresponding to one weight may be stored one bit at a time in two or more memory cells MC sequentially arranged along a predetermined direction. When one weight is converted into 3-bit weight data, 1 bit of weight data may be stored in three memory cells MC arranged in succession in a predetermined direction.

In example embodiments, bits of weight data corresponding to one weight may be distributedly stored in two or more memory cells MC arranged (i.e. aligned) in the first direction. Additionally, weights corresponding to one layer among a plurality of layers included in the neural network may be stored in memory cells arranged at the same height in the third direction. Therefore, the magnitude of the current flowing through the plurality of bit lines BL1 to BL3 or the plurality of source lines SL1 to SL3 in inference operations or the like may be reduced, and the power consumption of semiconductor devices may be reduced and integration may be improved.

Figure 5:
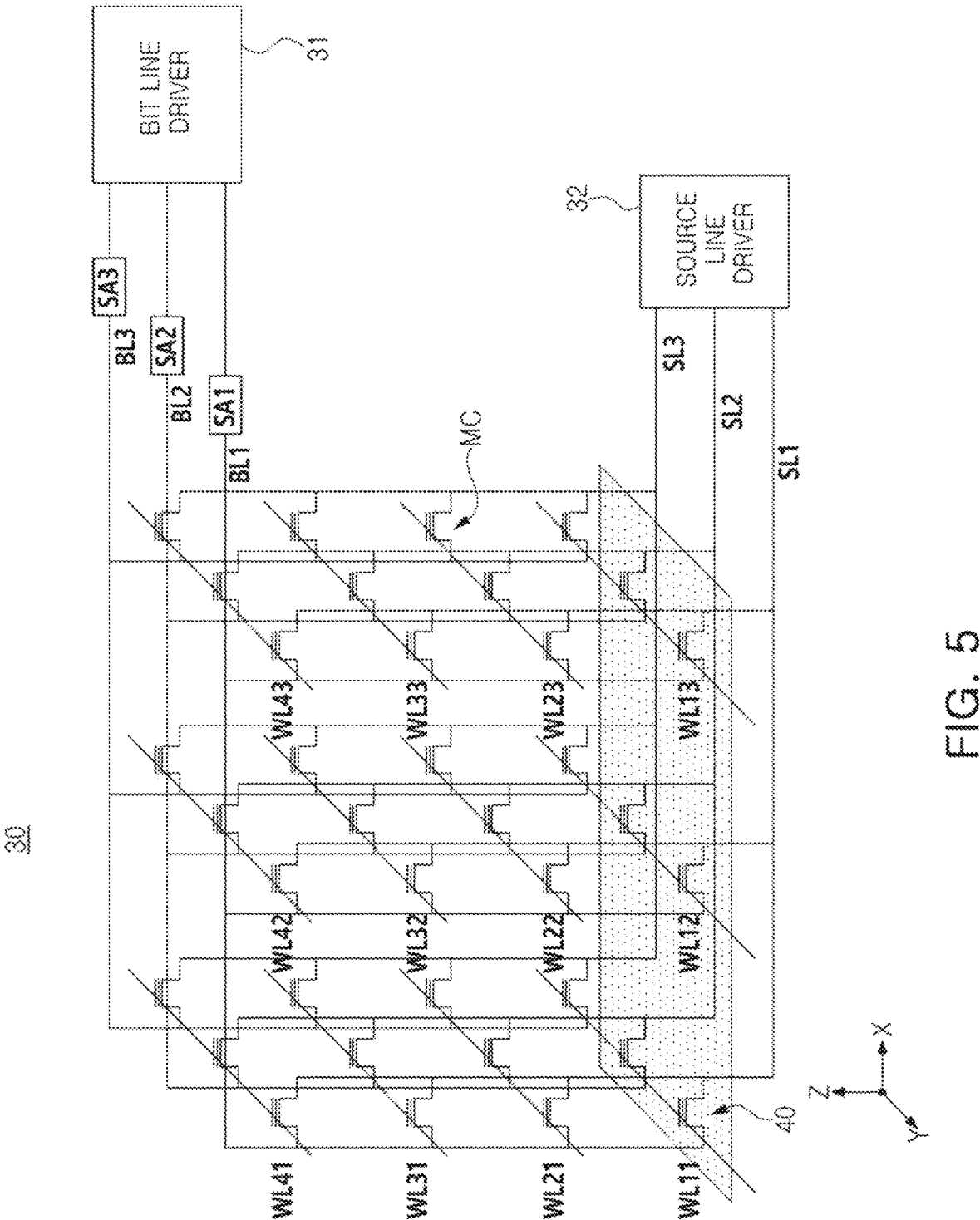
FIG. 5 is a diagram showing the operation of a semiconductor device according to example embodiments.
Figure 6:
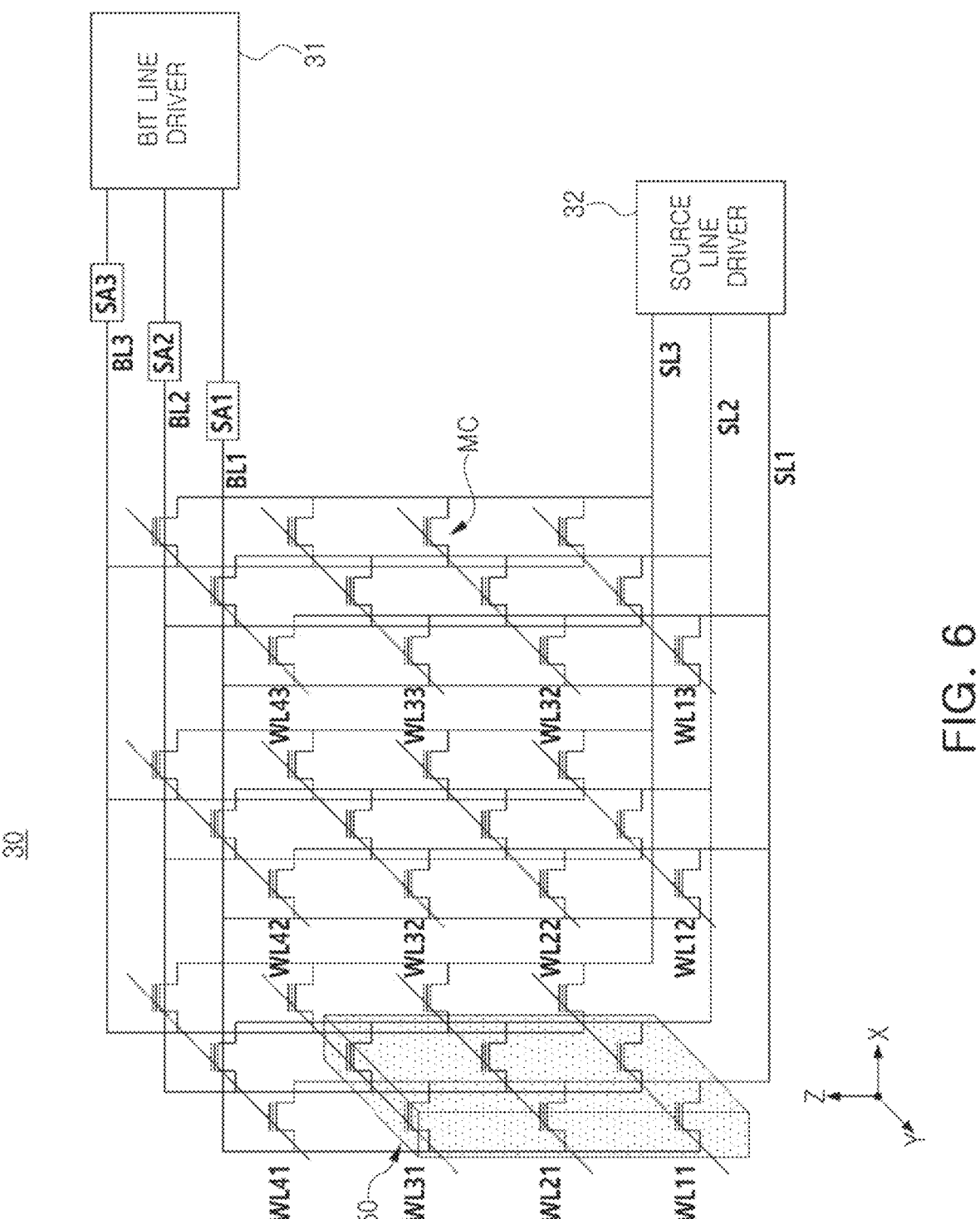
FIG. 6 is a diagram showing the operation of a semiconductor device according to example embodiments.

FIGS. 5 and 6 are drawings provided to illustrate the operation of a semiconductor device according to example embodiments.

Referring to FIGS. 5 and 6, a semiconductor device according to example embodiments may include a memory cell array 30, a plurality of sense amplifiers SA1 to SA3, a bit line driver 31, a source line driver 32, and the like. In an example embodiment described with reference to FIGS. 5 and 6, a plurality of sense amplifiers SA1 to SA3 are illustrated as connected to a plurality of bit lines BL1 to BL3, but unlike this, a plurality of sense amplifiers SA1 to SA3 may be connected to a plurality of source lines SL1 to SL3.

In an example embodiment illustrated in FIG. 5, weights corresponding to one layer among a plurality of layers included in the neural network may be stored in the first cell group 40 including six memory cells MC disposed on the same level (same height) in the third direction. For example, 3 bits of first weight data corresponding to the first weight may be stored 1 bit each in three memory cells MC connected to the first source line SL1 and the first bit line BL1. Additionally, 3 bits of second weight data corresponding to the second weight may be stored 1 bit each in the three memory cells MC connected to the second source line SL2 and the second bit line BL2.

In the comparative example illustrated in FIG. 6, the weights corresponding to one layer among the plurality of layers included in the neural network may be stored in the second cell group 50 including six memory cells MC arranged in the third direction and at the same position in the first direction. For example, 3 bits of first weight data corresponding to the first weight may be stored 1 bit each in three memory cells MC connected to the first source line SL1 and the first bit line BL1. Additionally, 3 bits of second weight data corresponding to the second weight may be stored 1 bit each in the three memory cells MC connected to the second source line SL2 and the second bit line BL2.

The first weight and the second weight may be weights given to paths connecting one node to two different nodes in a neural network. Accordingly, in an inference operation based on a neural network, each of the first weight and the second weight may be multiplied by the same input value.

In an example embodiment illustrated in FIG. 5, the input value multiplied by each of the first weight and the second weight may be converted into 3-bit input data and input to the three activated word lines WL11 to WL13. One bit out of the three bits constituting the input data may be simultaneously input to the activated word lines WL11 to WL13. For example, the highest bit of the input data is commonly input to the activated word lines WL11 to WL13 first, and then the middle bit is commonly input to the activated word lines WL11 to WL13, and afterwards, the lowest bit may be commonly input to the activated word lines WL11 to WL13. The input order of bits may vary depending on example embodiments.

Meanwhile, in the comparative example illustrated in FIG. 6, the three bits constituting the input data may be commonly input to the activated word lines WL11 to WL31 one at a time. In detail, the method of inputting input data into the activated word lines WL11 to WL31 in the comparative example illustrated in FIG. 6 may be similar to the example embodiment illustrated in FIG. 5.

However, in an example embodiment illustrated in FIG. 5, the memory cells MC of the first group 40 disposed at one level among the four layer levels are driven simultaneously, and thus, compared to the case in which the memory cells MC of the second group 50 disposed at different levels are driven simultaneously, the semiconductor device may operate with only a relatively small current. Accordingly, each of the elements included in the sense amplifiers SA1 to SA3 may be implemented as an element that may operate at a small operating voltage, thereby improving the integration of the semiconductor device. Additionally, as the current size decreases, the power consumption of the semiconductor device may be lowered.

Figure 7:
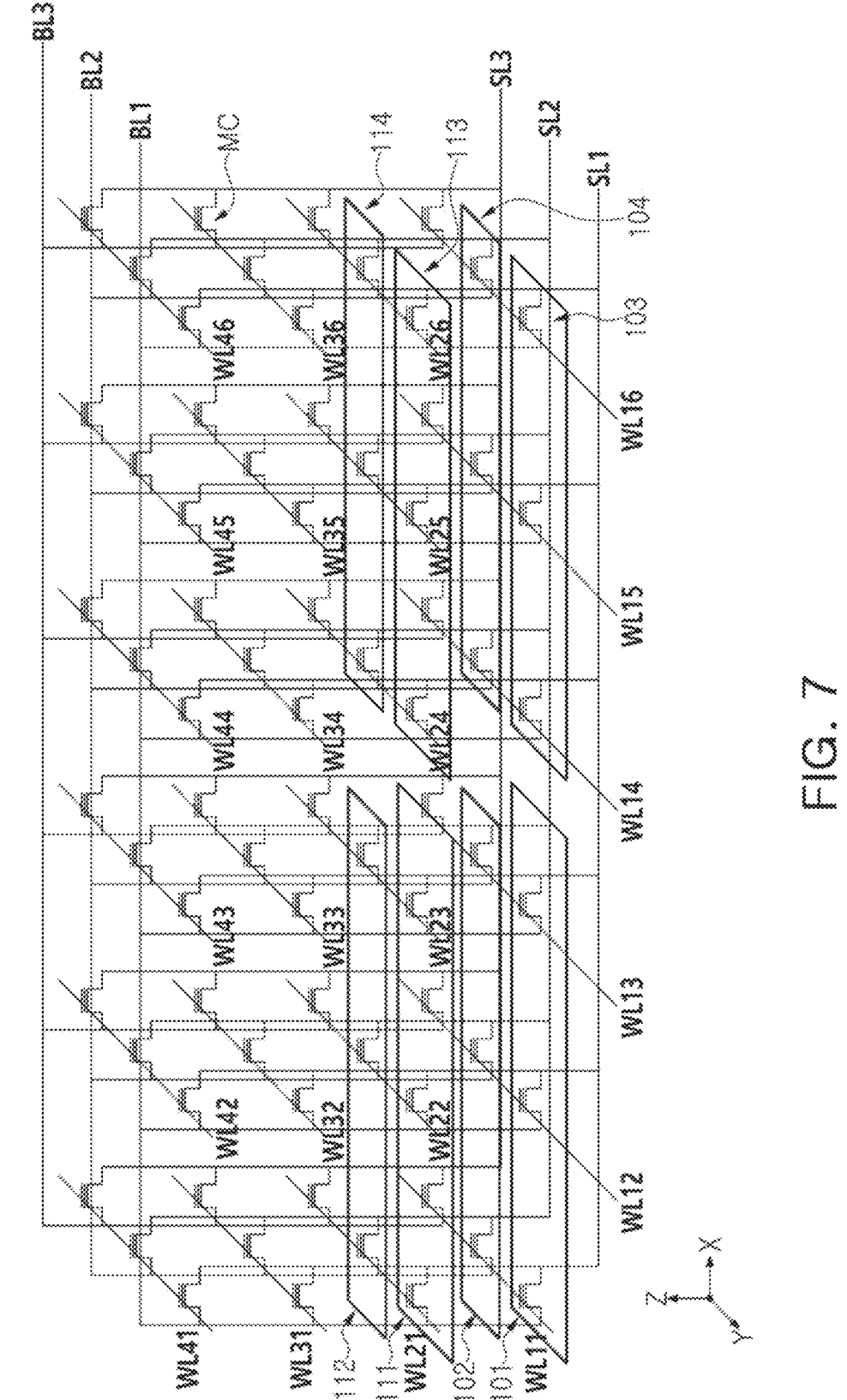
FIG. 7 is a diagram showing the operation of a semiconductor device according to example embodiments.
Figure 8:
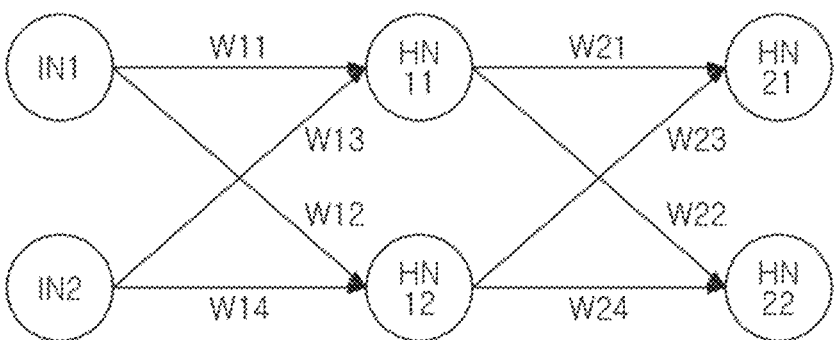
FIG. 8 is a diagram showing the operation of a semiconductor device according to example embodiments.

FIGS. 7 and 8 are drawings provided to illustrate the operation of a semiconductor device according to example embodiments.

Referring to FIG. 7, the memory cell array 100 of a semiconductor device according to example embodiments may include a plurality of memory cells MC arranged in a first direction (X-axis direction), a second direction (Y-axis direction), and a third direction (Z-axis direction). The plurality of memory cells MC may be connected to a plurality of bit lines BL1 to BL3 and a plurality of source lines SL1 to SL3 extending in the first direction. Additionally, the plurality of memory cells MC may be connected to the plurality of word lines WL11 to WL46 extending in the second direction.

Weight data obtained by converting weights included in the neural network may be stored in the memory cells MC. For example, in a neural network, weights are assigned to connection paths between adjacent nodes, and each of the weights may be converted into n-bit weight data (where n is a natural number of 2 or more) and stored in the memory cells MC.

Depending on example embodiments, n bits of weight data corresponding to one weight may be stored in each of n memory cells MC, one bit at a time. For example, when one weight is converted into 3-bit weight data, the most significant bit, middle bit, and least significant bit of the weight data may be distributed and stored by 1 bit each in three memory cells MC.

Bits included in the weight data may be stored one bit at a time in two or more memory cells MC arranged in series. In an example embodiment illustrated in FIG. 7, one weight is converted into 3 bits of weight data, and weight data of 1 bit may be stored in three memory cells MC sequentially arranged (i.e. aligned) in the first direction.

Referring to FIG. 7, first to eighth cell groups 101 to 104 and 111 to 114 may be defined in the memory cell array 100. 3-bit weight data obtained by converting the weights included in the neural network may be stored in each of the first to eighth cell groups 101 to 104 and 111 to 114. For example, the weight data stored in the first to eighth cell groups 101 to 104 and 111 to 114 may be data obtained by digitally converting the weights W11 to W14 and W21 to W24 included in the neural network according to the example embodiment illustrated in FIG. 8.

FIG. 8 may be a diagram simply illustrating a part of a neural network according to example embodiments. Referring to FIG. 8, the two input nodes IN1 and IN2 included in the input layer of the neural network may be fully-connected to the first and second hidden nodes HN11 and HN12 included in the first hidden layer. Additionally, the first and second hidden nodes HN11 and HN12 may be fully-connected to the third and fourth hidden nodes HN21 and HN22 included in the second hidden layer.

The first weight W11 and the second weight W12 are weights given to the path connecting the first input node IN1 and the first and second hidden nodes HN11 and HN12, respectively, and the third weight W13 and the fourth weight W14 may be weights assigned to a path connecting the second input node IN2 and the first and second hidden nodes HN11 and HN12, respectively. Meanwhile, the fifth weight W21 is given to the connection path between the first hidden node HN11 and the third hidden node HN21, and the sixth weight W22 may be assigned to the connection path between the first hidden node HN11 and the fourth hidden node HN22. The seventh weight W23 is given to the connection path between the second hidden node HN12 and the third hidden node HN21, and the eighth weight W24 may be assigned to the connection path between the second hidden node HN12 and the fourth hidden node HN22.

Each of the first to eighth weights W11 to W14 and W21 to W24 may be converted into 3-bit weight data and stored in the memory cell array 100. For example, the first weight data obtained by converting the first weight W11 is stored by 1 bit each in the three memory cells MC included in the first cell group 101, and the second weight data obtained by converting the second weight W12 may be stored as 1 bit each in the three memory cells MC included in the second cell group 102. Third weight data converted from the third weight W13 is stored in the memory cells MC of the third cell group 103, and the fourth weight data obtained by converting the fourth weight W14 may be stored in the memory cells MC of the fourth cell group 104.

Meanwhile, the fifth weight data obtained by converting the fifth weight W21 is stored in the memory cells MC of the fifth cell group 111, and the sixth weight data obtained by converting the sixth weight W22 may be stored in the memory cells MC of the sixth cell group 112. The seventh weight data converted from the seventh weight W23 is stored in the memory cells MC of the seventh cell group 113, and the eighth weight data obtained by converting the eighth weight W24 may be stored in the memory cells MC of the eighth cell group 114.

As such, in example embodiments, weights corresponding to each of the layers included in the neural network may be stored in memory cells MC disposed at one level in the memory cell array 100. In an example embodiment described with reference to FIGS. 7 and 8, the first to fourth weights W11 to W14 corresponding to the first hidden layer may be stored in memory cells MC disposed on the first layer of the memory cell array 100. Additionally, the fifth to eighth weights W21 to W24 corresponding to the second hidden layer may be stored in the memory cells MC disposed on the second layer of the memory cell array 100.

However, memory cells storing one piece of weight data may be arranged in the second direction, unlike the example embodiment illustrated in FIG. 7. For example, the first weight data obtained by converting the first weight W11 may be stored as 1 bit each in three memory cells MC arranged in the first layer and connected to the first word line WL11. In the process of executing the inference operation, the word line driver may input the first input data corresponding to the first input node IN1 1 bit at a time to the first word line WL11.

As such, in example embodiments, two or more memory cells MC that distribute and store one weight data may be arranged (i.e. aligned) in the first or second direction in one-level layer included in the memory cell array 100. Accordingly, power consumption may be reduced by reducing the amount of current flowing through the bit lines BL1 to BL3 and/or source lines SL1 to SL3 in inference operations or the like. In addition, the sense amplifier connected to the bit lines BL1 to BL3 or source lines SL1 to SL3 may be implemented with a relatively small device, and the degree of integration of the semiconductor device may be increased.

Figure 9:
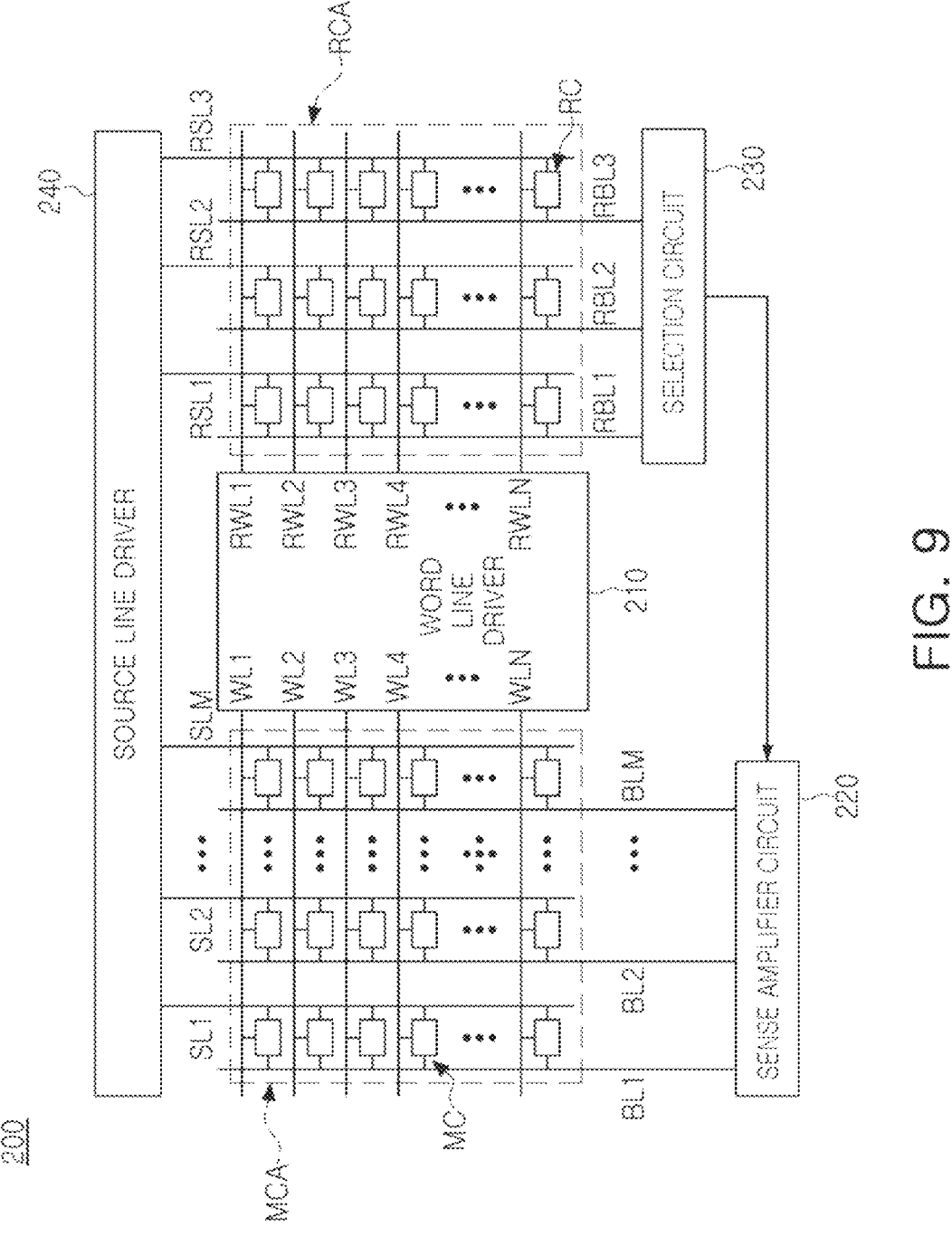
FIG. 9 is a diagram simply illustrating a semiconductor device according to example embodiments.

FIG. 9 is a diagram simply illustrating a semiconductor device according to example embodiments.

Referring to FIG. 9, a semiconductor device 200 according to example embodiments may include a memory cell array MCA, a reference cell array RCA, a word line driver 210, a sense amplifier circuit 220, a selection circuit 230, a source line driver 240, and the like. The memory cell array MCA may include a plurality of memory cells MC, and the reference cell array RCA may include a plurality of reference cells RC.

The plurality of reference cells RC may have the same structure as the plurality of memory cells MC. For example, each of the plurality of memory cells MC and the plurality of reference cells RC includes a memory element including a ferroelectric layer, and data may be recorded by changing the threshold voltage of the memory element by adjusting the polarization direction and degree of polarization of the ferroelectric layer. Alternatively, each of the plurality of memory cells MC and the plurality of reference cells RC may include a switch element and a resistive memory element that records data by changing resistance.

The word line driver 210 may be connected to the memory cell array MCA through word lines WL1 to WLN and may be connected to the reference cell array RCA through reference word lines RWL1 to RWLN. The sense amplifier circuit 220 may be connected to the memory cell array MCA through bit lines BL1 to BLM, and the selection circuit 230 may be connected to the reference cell array RCA through the reference bit lines RBL1 to RBL3.

In the reference cell array RCA, the plurality of reference cells RC may be disposed at locations where the reference word lines RWL1 to RWLN intersect the reference bit lines RBL1 to RBL3 and the reference source lines RSL1 to RSL3. The reference cell array RCA may output a plurality of reference currents to the selection circuit 230 through the reference bit lines RBL1 to RBL3. However, depending on example embodiments, when the selection circuit 230 is connected to the reference source lines RSL1 to RSL3, a plurality of reference currents may be output to the reference source lines RSL1 to RSL3.

The number of reference bit lines RBL1 to RBL3 and reference source lines RSL1 to RSL3 may vary depending on the encoder that digitally converts the output of the sense amplifier circuit 220. For example, when the encoder converts the output of the sense amplifier circuit 220 into a k-bit digital signal, the number of reference bit lines RBL1 to RBL3 and the number of reference source lines RSL1 to RSL3 may each be 2 k−1. The encoder may provide an analog-to-digital converter along with the sense amplifier circuit 220.

In an example embodiment illustrated in FIG. 9, the reference currents necessary for the analog-to-digital converter to convert the output of the sense amplifier circuit 220 into a 2-bit digital signal may be provided from the reference cell array RCA. The sense amplifier circuit 220 includes a plurality of sense amplifiers connected to bit lines BL1 to BLM of the memory cell array MCA, and each of the sense amplifiers may generate output signals by comparing the current output from each of the bit lines BL1 to BLM with reference currents. The encoder may generate a 2-bit digital signal using output signals. The detailed operation of the sense amplifier circuit 220 and the encoder will be described later.

The reference cell array RCA may output a first reference current to the first reference bit line RBL1 and a second reference current to the second reference bit line RBL2, and may output a third reference current to the third reference bit line RBL3. The reference cells RC connected to the first reference bit line RBL1 may be programmed so that the number of reference cells RC having a high threshold voltage is the first number. The reference cells RC connected to the second reference bit line RBL2 may be programmed so that the number of reference cells RC having a high threshold voltage is the second number, which is less than the first number. Meanwhile, the reference cells RC connected to the third reference bit line RBL3 may be programmed so that the number of reference cells RC having a high threshold voltage is a third number that is less than the second number.

Accordingly, the first reference current is the smallest, the third reference current is the largest, and the second reference current may be larger than the first reference current and smaller than the third reference current. While executing inference operations based on neural networks, the word line driver 210 may activate all of the reference word lines RWL1 to RWLN and output first to third reference currents to the first to third reference bit lines RBL1 to RBL3. Each of the sense amplifiers included in the sense amplifier circuit 220 may compare the output current of each of the bit lines BL1 to BLM with the first to third reference currents and may output output signals to an encoder. The encoder may convert the output signals of each sense amplifier into digital signals and output the converted signals.

Weight data obtained by digitally converting each weight assigned to a connection path of nodes in a neural network may be stored in a memory cell array MCA. For example, the word line driver 210 may input input data for each node of the neural network by activating at least some of the word lines WL1 to WLN.

Referring to the example embodiment illustrated in FIG. 8, first input data output from the first input node IN1 is input to the first word line WL1, and second input data output from the second input node IN2 may be input to the second word line WL2. Each of the first input data and the second input data may be digital data. When each of the first input data and the second input data is digital data of 2 bits or more, each of the first input data and the second input data may be input by 1 bit to the first word line WL1 and the second word line WL2.

Weight data obtained by digitally converting each of the first weight W11 and the second weight W12 may be distributed and stored 1 bit at a time, in at least some of the memory cells MC connected to the first word line WL1. Meanwhile, in at least some of the memory cells MC connected to the second word line WL2, weight data obtained by digitally converting each of the third weight W13 and the fourth weight W14 may be distributed and stored 1 bit at a time.

For example, each of the first to fourth weights W11 to W14 may be converted into 3-bit first to fourth weight data. The first weight data is stored as 1 bit each in three memory cells MC connected to the first word line WL1 and the first to third bit lines BL1 to BL3, and the second weight data may be stored as 1 bit each in three memory cells MC connected to the first word line WL1 and the fourth to sixth bit lines BL4 to BL6. Likewise, the third weight data is stored as 1 bit each in the three memory cells MC connected to the second word line WL2 and the first to third bit lines BL1 to BL3, and the fourth weight data may be stored as 1 bit each in three memory cells MC connected to the second word line WL2 and the fourth to sixth bit lines BL4 to BL6. The MAC operation result value input to the first hidden node HN11 is output to the first to third bit lines BL1 to BL3, and the MAC operation result value input to the second hidden node HN12 may be output to the fourth to sixth bit lines BL4 to BL6.

FIGS. 10 to 13 are diagrams simply illustrating an analog-to-digital converter included in a semiconductor device according to example embodiments.

Figure 10:
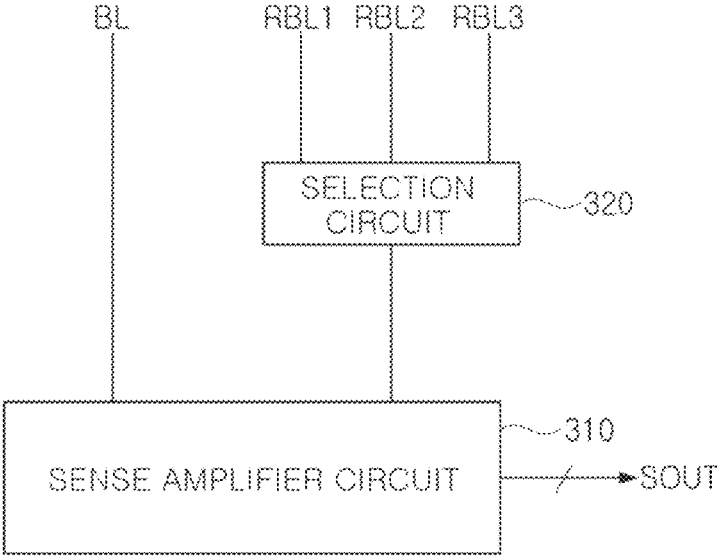
FIG. 10 is a diagram simply illustrating an analog-to-digital converter included in a semiconductor device according to example embodiments.
Figure 11:
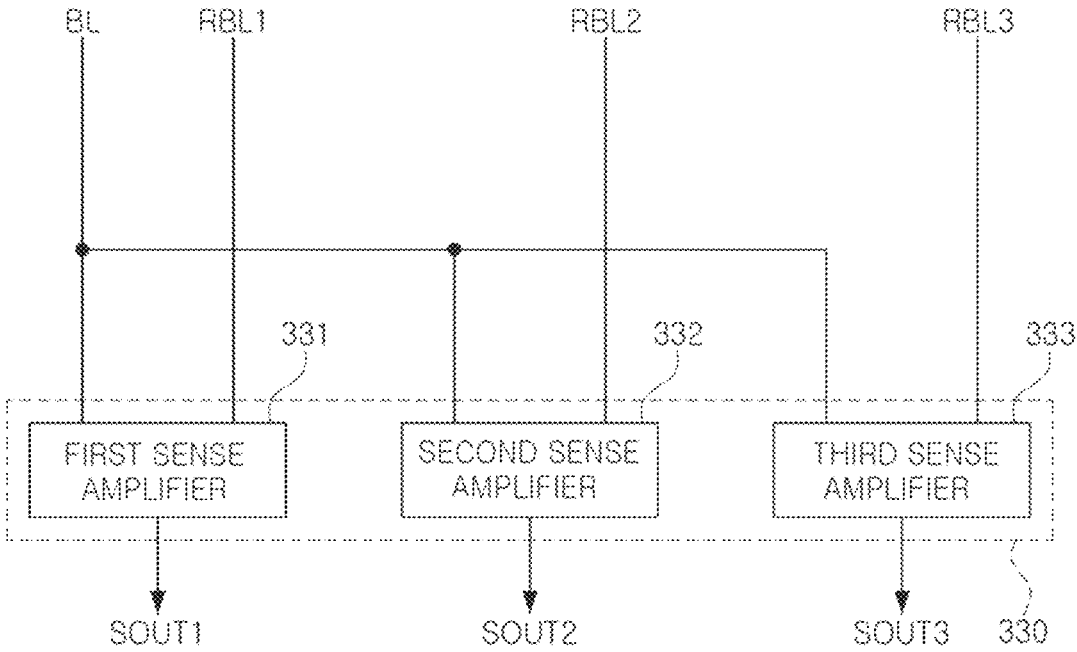
FIG. 11 is a diagram simply illustrating an analog-to-digital converter included in a semiconductor device according to example embodiments.

FIGS. 10 and 11 may be diagrams provided to illustrate the configuration and operation of the sense amplifier circuit. First, referring to FIG. 10, the sense amplifier 310 is connected to one bit line BL and a selection circuit 320, and the selection circuit 320 may be connected to the reference bit lines RBL1 to RBL3. As previously described with reference to FIG. 9, the reference bit lines RBL1 to RBL3 may be connected to reference cells arranged in the reference cell array.

When the semiconductor device starts an inference operation based on a neural network, the word line driver may activate reference word lines connected to reference cells. Depending on the states of pre-programmed reference cells, each of the reference bit lines RBL1 to RBL3 may output different reference currents. The selection circuit 320 may transfer the reference currents output from the reference bit lines RBL1 to RBL3 to the sense amplifier 310 one by one.

The sense amplifier 310 may include a first input terminal connected to the bit line BL and a second input terminal connected to the output terminal of the selection circuit 320, and may generate output signal SOUT by comparing the current of the bit line BL transmitted to the first input terminal with one reference current transmitted to the second input terminal. For example, if the current of the bit line BL is greater than the reference current, the output signal SOUT may be output at a voltage level corresponding to a high logic value. Depending on the operation of the selection circuit 320, the sense amplifier 310 may sequentially compare the current of the bit line BL with a plurality of reference currents and output a plurality of output signals SOUT.

In an example embodiment illustrated in FIG. 10, one bit line BL connected to memory cells in the memory cell array may be connected to one sense amplifier 310. Two or more sense amplifiers 310 connected to different bit lines BL may share one selection circuit 320. In detail, the output terminal of the selection circuit 320 may be commonly connected to the second input terminal of each of the two or more sense amplifiers 310.

In an example embodiment illustrated in FIG. 11, one bit line BL may be connected to a plurality of sense amplifiers 331 to 333 included in the sense amplifier circuit 330. The number of sense amplifiers 331 to 333 may be equal to the number of reference bit lines RBL1 to RBL3 or the number of reference currents output from the reference cell array.

The first sense amplifier 331 may compare the current of the bit line BL with the first reference current output from the first reference bit line RBL1 and output a first output signal SOUT1. The second sense amplifier 332 compares the current of the bit line BL with the second reference current output by the second reference bit line RBL2 and outputs a second output signal SOUT2, and the third sense amplifier 333 may compare the current of the bit line BL with the third reference current output from the third reference bit line RBL3 and output a third output signal SOUT3.

Figures 12, 13:
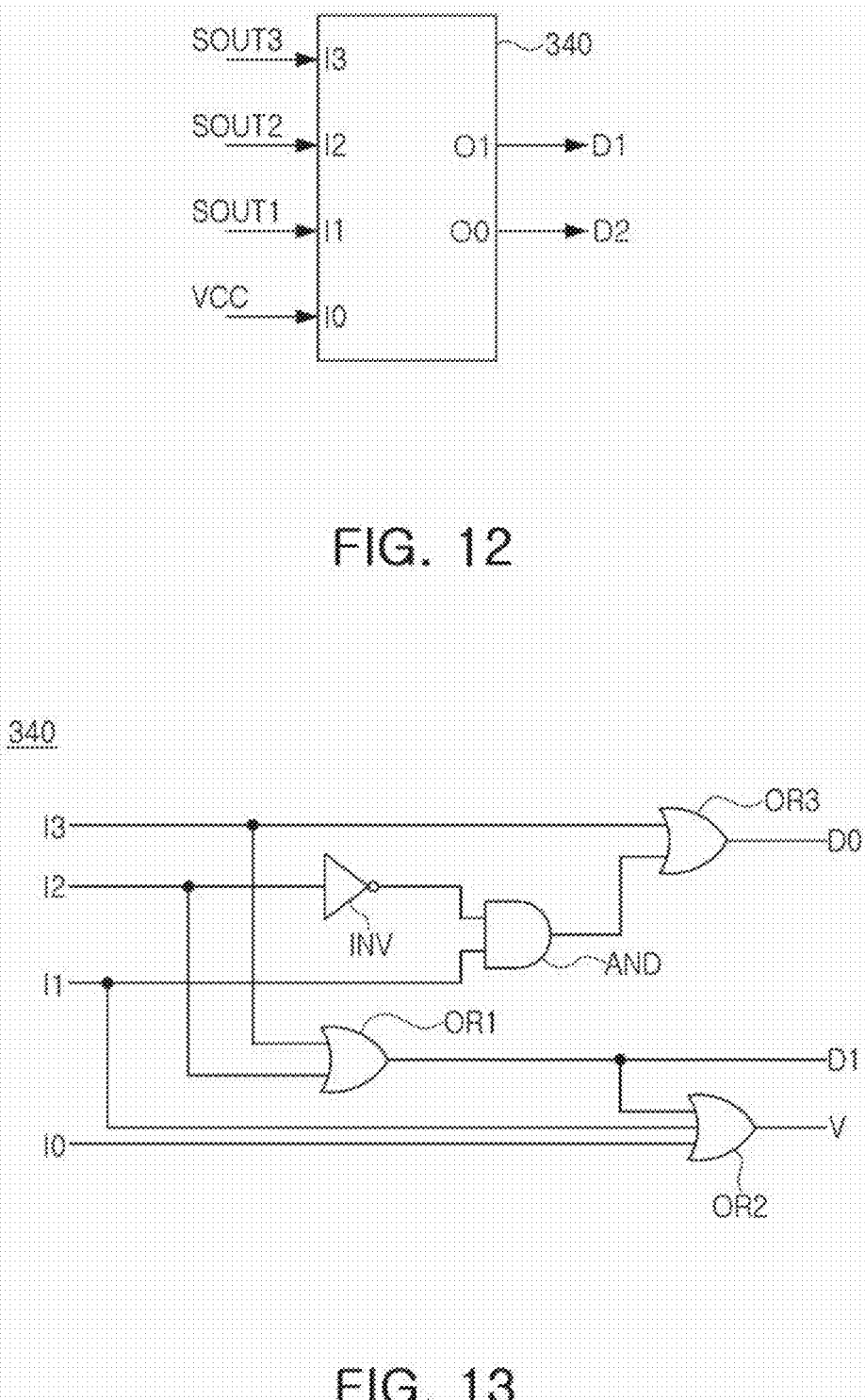
FIG. 12 is a diagram simply illustrating an analog-to-digital converter included in a semiconductor device according to example embodiments.
FIG. 13 is a diagram simply illustrating an analog-to-digital converter included in a semiconductor device according to example embodiments.

Referring to FIG. 12, a plurality of output signals SOUT1 to SOUT3 output from a sense amplifier and a power supply voltage VCC may be input to the input terminals I0 to I3 of the encoder 340. The encoder 340 may send out the first bit DO to the first output terminal O0 and the second bit D1 to the second output terminal O1, using the power supply voltage VCC and multiple output signals SOUT1 to SOUT3. The first bit DO may correspond to the first bit of the digital signal generated by the encoder 340, and the second bit D1 may correspond to the second bit of the digital signal generated by the encoder 340.

FIG. 13 may be a diagram simply illustrating the circuit of the encoder 340 according to example embodiments. Referring to FIG. 13, the encoder 340 may include first to third OR gates OR1 to OR3, an AND gate AND, an inverter INV, and the like. The first bit DO and the second bit D1 of the digital signal output by the encoder 340 according to the example embodiment illustrated in FIG. 13 may be as illustrated in Table 1 below.

TABLE 1

| I0 | 1 | 1 | 1 | 1 |
| I1 | 0 | 1 | 0 | 0 |
| I2 | 0 | 0 | 1 | 0 |
| I3 | 0 | 0 | 0 | 1 |

TABLE 1-continued

| D0 | 0 | 1 | 0 | 1 |
| D1 | 0 | 0 | 1 | 1 |

Figure 14:
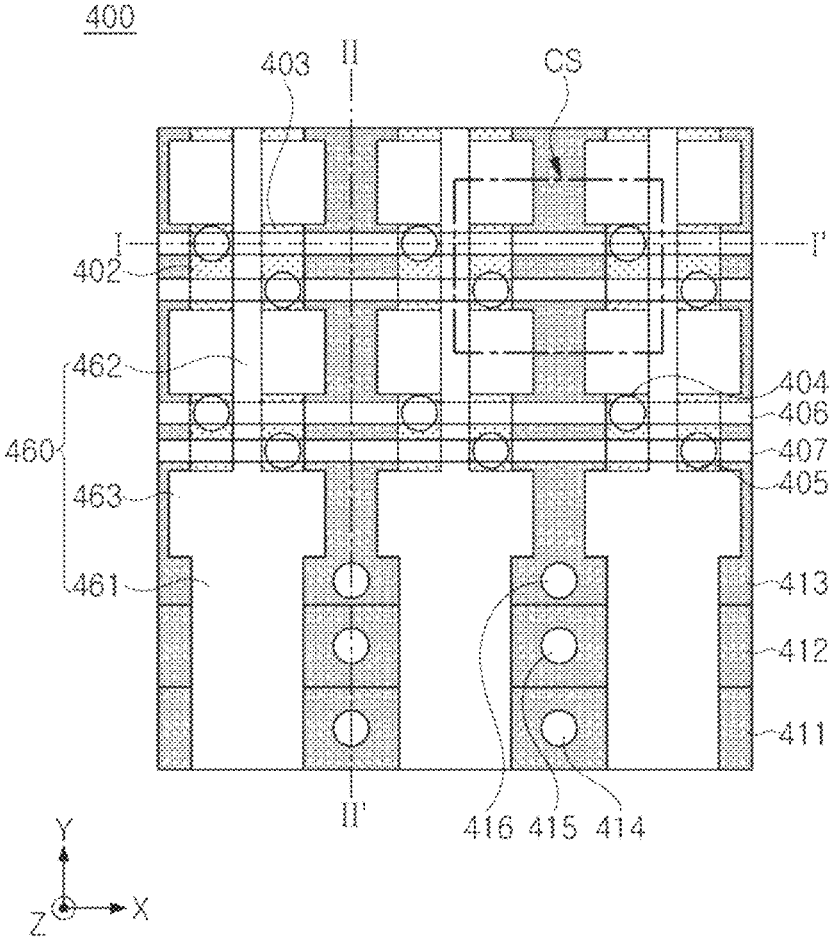
FIG. 14 is a schematic diagram illustrating the cell area of a semiconductor device according to example embodiments.
Figure 15:
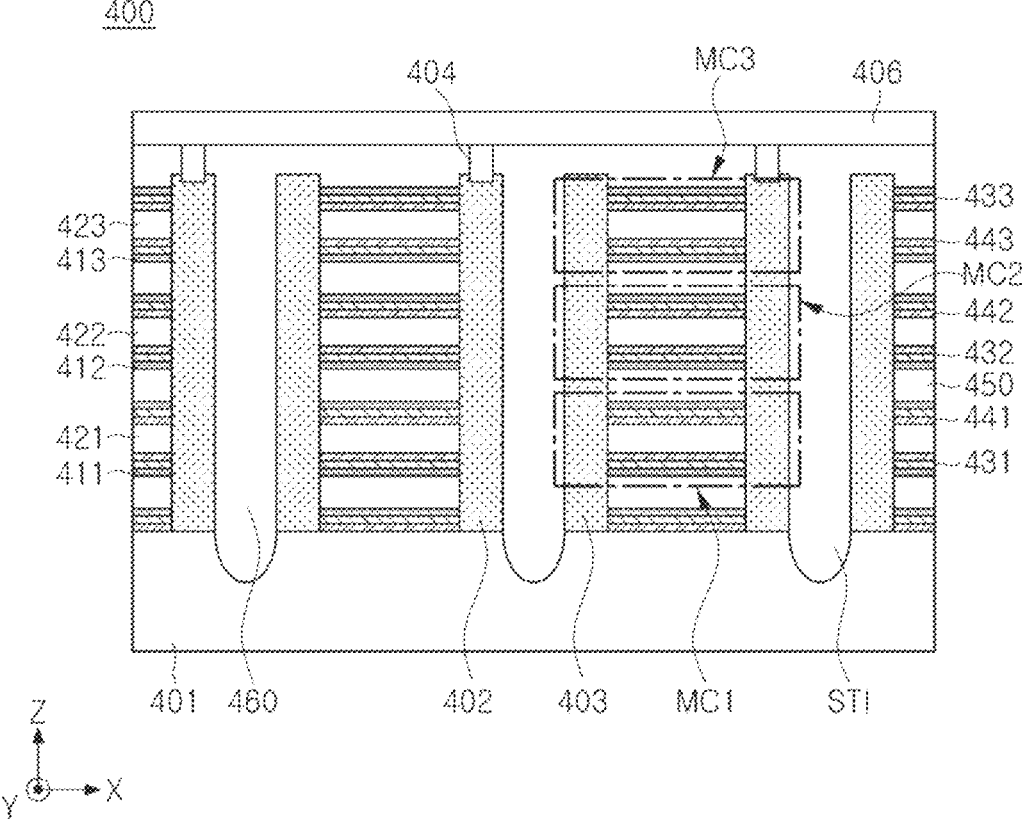
FIG. 15 is a schematic diagram illustrating the cell area of a semiconductor device according to example embodiments.
Figure 16:
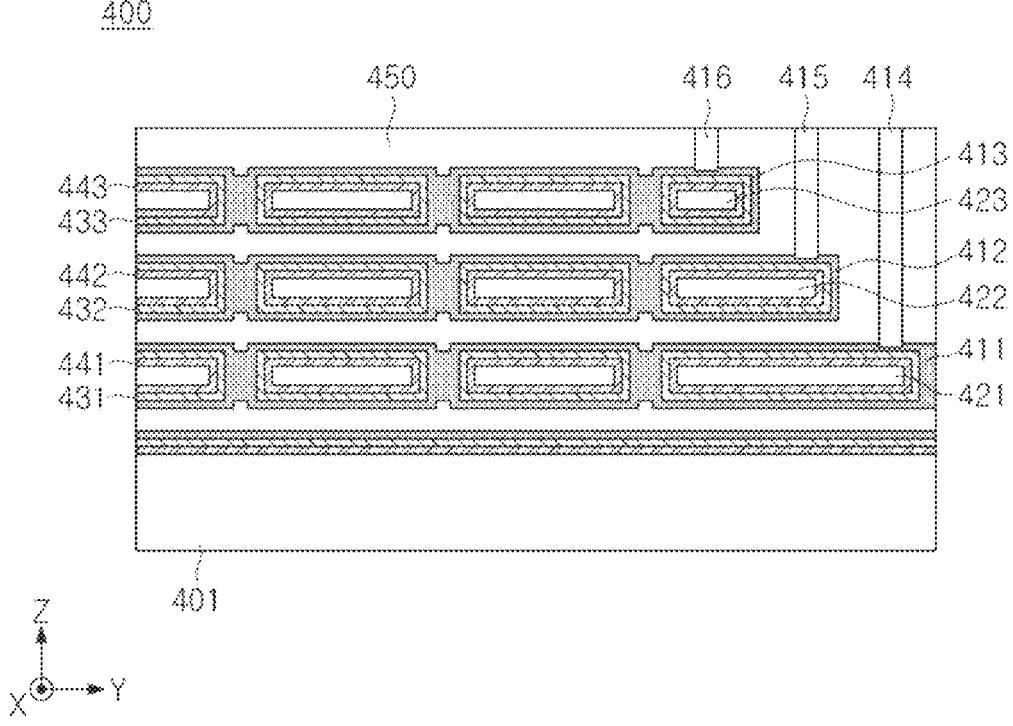
FIG. 16 is a schematic diagram illustrating the cell area of a semiconductor device according to example embodiments.

FIGS. 14 to 16 are diagrams simply illustrating the cell area of a semiconductor device according to example embodiments.

FIG. 14 is a plan view simply illustrating a portion of the semiconductor device 400 according to example embodiments, and FIG. 15 may be a cross-sectional view illustrating a cross-section taken along line I-I' of FIG. 14. FIG. 16 may be a cross-sectional view illustrating a cross-section taken along line II-II' of FIG. 14. FIGS. 14 to 16 may be diagrams illustrating a portion of a cell area in the semiconductor device 400 where a plurality of memory cells MC are disposed.

Referring to FIGS. 14 to 16, in the semiconductor device 400 according to example embodiments, the plurality of memory cells MC may be arranged along a first direction (X-axis direction) and a second direction (Y-axis direction) parallel to the upper surface of the substrate 401. Each of the plurality of memory cells MC may include a first active area 402 and a second active area 403 adjacent to each other in a first direction, a plurality of channel layers 421 to 423 extending in a first direction between the first active area 402 and the second active area 403, a plurality of ferroelectric layers 431 to 433 and a plurality of gate electrode layers 411 to 413 arranged in order on the plurality of channel layers 421 to 423, and the like. Additionally, a plurality of gate insulating layers 441 to 443 may be disposed between the plurality of channel layers 421 to 423 and the plurality of ferroelectric layers 431 to 433.

In an example embodiment illustrated in FIGS. 14 to 16, the first channel layer 421, the second channel layer 422, and the third channel layer 423 disposed in the same position in the first and second directions may be commonly connected to the first active area 402 and the second active area 403. Additionally, the first to third channel layers 421 to 423 may be separated from each other in a third direction (Z-axis direction) perpendicular to the upper surface of the substrate 401. The number of channel layers 421 to 423 connected between the first active area 402 and the second active area 403 may vary depending on example embodiments. For example, to implement a memory cell array like the example embodiments previously described with reference to FIGS. 4 to 7, four channel layers may be connected between the first active area 402 and the second active area 403. An interlayer insulating layer 450 is disposed between the plurality of channel layers 421 to 423 in the third direction, and the interlayer insulating layer 450 may be formed of an insulating material such as silicon oxide, silicon nitride, or silicon oxynitride.

For example, the first channel layer 421 is connected to the first active area 402 and the second active area 403 on both sides in the first direction and may include a semiconductor material. A first ferroelectric layer 431 and a first gate electrode layer 411 may be arranged in that order on the first channel layer 421. For example, the first ferroelectric layer 431 may include a ferroelectric material such as hafnium (Hf), zirconium (Zr), silicon (Si), yttrium (Y), aluminum (Al), gadolinium (Gd), strontium (Sr), lanthanum (La), scandium (Sc), oxides thereof, and the like. A first gate insulating layer 441 may be disposed between the first ferroelectric layer 431 and the first channel layer 421, and the first gate insulating layer 441 may be formed of silicon oxide, or the like.

Referring to FIGS. 15 and 16, the first channel layer 421 may extend in the first direction and be connected to the first active area 402 and the second active area 403 on both sides, and may also extend in the second direction. Additionally, the first channel layer 421 may be surrounded by a first gate insulating layer 441, a first ferroelectric layer 431, and a first gate electrode layer 411 in the second and third directions.

A plurality of memory cells MC are arranged in a three-dimensional form along first to third directions, and the first channel layer 421 included in each of the memory cells MC adjacent to each other in the second direction may be separated from each other. Meanwhile, the first gate electrode layer 411 included in the memory cells MC arranged at the same position in the first direction and at the same height in the third direction may be connected together in the second direction to provide one word line as illustrated in FIG. 16.

The second channel layer 422 and the third channel layer 423 and the surrounding structures thereof may be similar to those described above. For example, the second channel layer 422 may be surrounded in the second and third directions by the second gate insulating layer 442, the second ferroelectric layer 432, and the second gate electrode layer 412, which are arranged in that order. The second channel layers 422 disposed in the same position in the first direction and at the same height in the third direction and adjacent in the second direction are separated from each other, and one second gate electrode layer 412 may surround adjacent second channel layers 422 in the second direction.

Meanwhile, as illustrated in FIG. 15, two or more memory cells MC arranged at the same position in the first and second directions and at different heights in the third direction may share the first active area 402 and second active area 403. As illustrated in FIG. 14, the first active area 402 is connected to the bit line 406 by the bit line contact 404. The second active area 403 may be connected to the source line 407 through the source line contact 405. Accordingly, the memory cells MC arranged at the same position in the first and second directions and at different heights in the third direction may provide one cell string as described above with reference to FIG. 4. The memory cells MC arranged at the same position in the first and second directions and at different heights in the third direction are connected to different gate electrode layers 411 to 413, and word lines may be provided by the gate electrode layers 411 to 413.

Referring to FIG. 14, a plurality of bit lines 406 and a plurality of source lines 407 may extend in the first direction. A plurality of bit lines 406 may be connected to a sense amplifier circuit and a bit line driver, and a plurality of source lines 407 may be connected to a source line driver. However, depending on example embodiments, the sense amplifier circuit may be connected to a plurality of source lines 407.

The plurality of gate electrode layers 411 to 413 may extend in the second direction to provide a plurality of word lines. The plurality of gate electrode layers 411 to 413 may be connected to the word line driver through a plurality of gate contacts 414 to 416. The word line driver may adjust the level of voltage input to at least some of the plurality of gate electrode layers 411 to 413 during control operations such as program operations and read operations.

The semiconductor device 400 may include a vertical insulating layer 460. For example, the vertical insulating layer 460 includes a first vertical insulating layer 461, a second vertical insulating layer 462, and a third vertical insulating layer 463, and each of the first to third vertical insulating layers 461 to 463 may have a different width in the first direction. For example, the second vertical insulating layer 462 may have the smallest width, and the third vertical insulating layer 463 may have the largest width. The vertical insulating layer 460 is formed of at least one of silicon oxide, silicon nitride, and silicon oxynitride, and for example, may be formed of the same material as the interlayer insulating layer 450. The third vertical insulating layer 463 may be an active insulating layer that separates the active areas 402 and 403 adjacent to each other in the second direction.

Referring to FIG. 14, the first vertical insulating layer 461 is adjacent to the gate contacts 414 to 416 in the first direction, and may separate the gate electrode layers 411 to 413, the channel layers 421 to 423, and the like from each other in the first direction. Meanwhile, the second vertical insulating layer 462 is included in different memory cells MC and may be disposed between the first active area 402 and the second active area 403 adjacent in the first direction. The third vertical insulating layer 463 may be disposed between the first vertical insulating layer 461 and the second vertical insulating layer 462 in the second direction. For example, a boundary between memory cells MC adjacent to each other in the first direction is determined by the second vertical insulating layer 462, and a boundary between adjacent memory cells MC in the second direction may be determined by the third vertical insulating layer 463. A portion of the second vertical insulating layer 462 may be formed to recess at least a portion of the substrate 401 to provide an isolation insulation film (Shallow Trench Isolation (STI)).

Weight data corresponding to weights included in the neural network may be stored in the memory cells MC. Each of the weights is converted into weight data of 2 bits or more, and 1 bit each may be stored in two or more memory cells MC arranged in series. For example, one bit of weight data may be stored in two or more memory cells that are commonly connected to one of the gate electrode layers 411 to 413 and arranged at the same height in the third direction.

For example, by inputting a first program voltage to the first gate electrode layer 411 and inputting a voltage of a predetermined level to each of the first active area 402 and the second active area 403, the polarization state of the first ferroelectric layer 431 may be changed, and the threshold voltage of the memory cell MC including the first gate electrode layer 411 may be reduced. At this time, by inputting a voltage different from the first program voltage to the second gate electrode layer 412, the polarization state of the second ferroelectric layer 432 may be adjusted to be different from that of the first ferroelectric layer 431 or programming may be prevented.

Meanwhile, an inference operation based on a neural network may correspond to a read operation of the semiconductor device 400 according to example embodiments. In a read operation, input data corresponding to input values transmitted to the corresponding layer may be input to selected memory cells MC that are arranged at the same height in the third direction and store weights corresponding to one layer included in the neural network. For example, a predetermined constant voltage is applied as a bias voltage to the source lines 407 connected to the selected memory cells MC, and bit lines 406 connected to the selected memory cells MC may be activated.

Meanwhile, the selection memory cells MC are disposed at the same height in the third direction, and may thus be commonly connected to one of the gate electrode layers 411 to 413. The word line driver may sequentially apply voltages corresponding to each bit included in the input data to the selection gate electrode layer. Accordingly, a current corresponding to the result value of the Multiply-Accumulate (MAC) operation may be output through the bit lines 406 to which the selected memory cells MC are connected.

Figure 17:
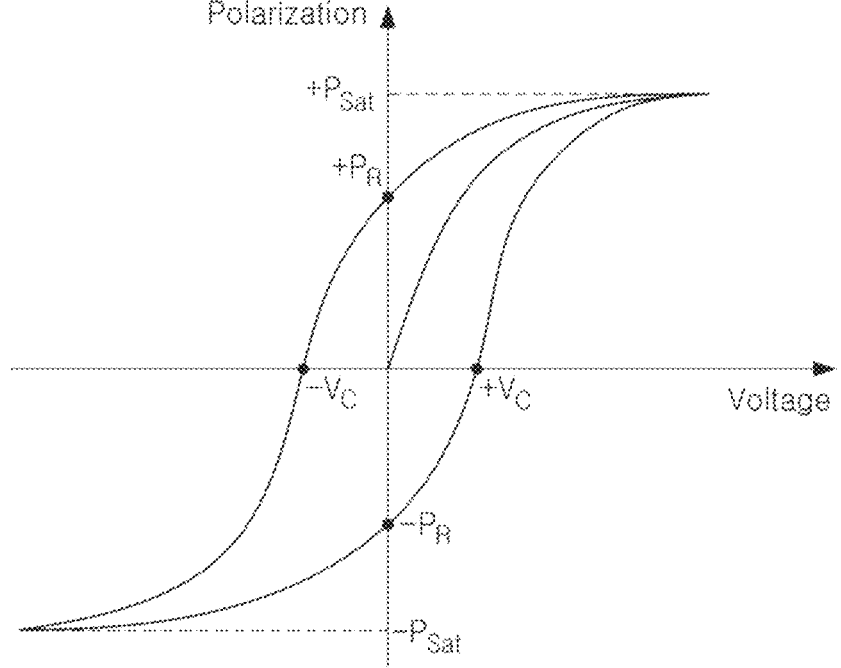
FIG. 17 is a diagram provided to illustrate the operation of a semiconductor device according to example embodiments.

FIG. 17 is a diagram provided to illustrate the operation of a semiconductor device according to example embodiments.

FIG. 17 may be a graph illustrating a hysteresis curve of a ferroelectric material included in a ferroelectric layer of a memory cell in the semiconductor device according to the example embodiment described with reference to FIGS. 14 to 16. Referring to FIG. 17, if no voltage is input to the gate electrode layer and an electric field is not applied to the ferroelectric layer, polarization may not occur.

For example, when the voltage input to the gate electrode layer increases in the positive direction, The polarization degree of the ferroelectric layer may range from 0 to the positive maximum point$+P_{sat}$, which is the saturation polarization point within the positive polarization region. Afterwards, even if the voltage input to the gate electrode layer is blocked, the polarization degree does not decrease back to zero but may stay at the positive remanent point$+P_R$, which is defined as the remanent polarization point.

Meanwhile, when the voltage input to the gate electrode layer increases in the negative direction, the polarization degree may move to the negative maximum point $-P_{sat}$ within the negative polarization region. At this time, the ferroelectric material included in the ferroelectric layer 231 may be polarized in a direction opposite to the polarization direction at the positive maximum point$+P_{sat}$. Even if the negative voltage input to the gate electrode layer is blocked, the polarization does not decrease back to 0 and may remain at the negative remanent point $-P_R$.

In this manner, to change the polarization direction of the ferroelectric layer, a voltage should be applied in the opposite direction. This voltage may be defined as the coercive voltages $+V_C$, and $-V_C$ illustrated in FIG. 7. For example, the core voltage $+V_C$, $-V_C$ may be proportional to the thickness of the ferroelectric layer and the coercive field of the ferroelectric material.

For example, in a semiconductor device according to example embodiments, the row decoder, which is connected to the gate electrode layer of each of the plurality of memory cells through a plurality of word lines, inputs a program voltage determined from the coercive voltage $+V_C$, $-V_C$ to the plurality of word lines, and may thus execute a program operation that records data in a plurality of memory cells. For example, the program voltage may include a first program voltage that is a negative voltage and a second program voltage that is a positive voltage. The absolute value of the first program voltage and the absolute value of the second program voltage may be the same.

Figure 18:
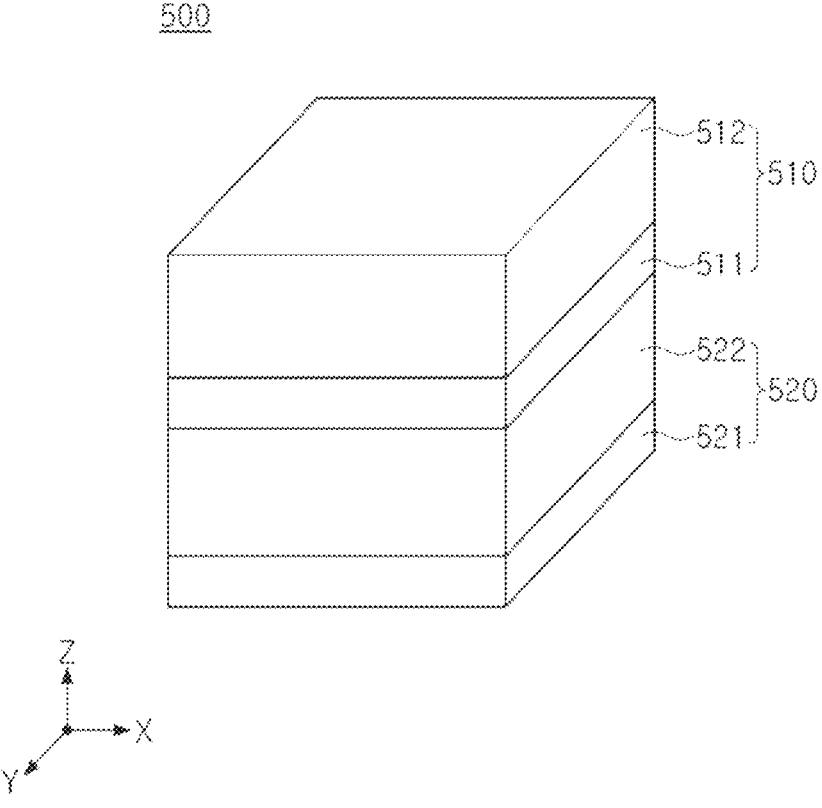
FIG. 18 is a schematic diagram of a semiconductor device according to example embodiments.
Figure 19:
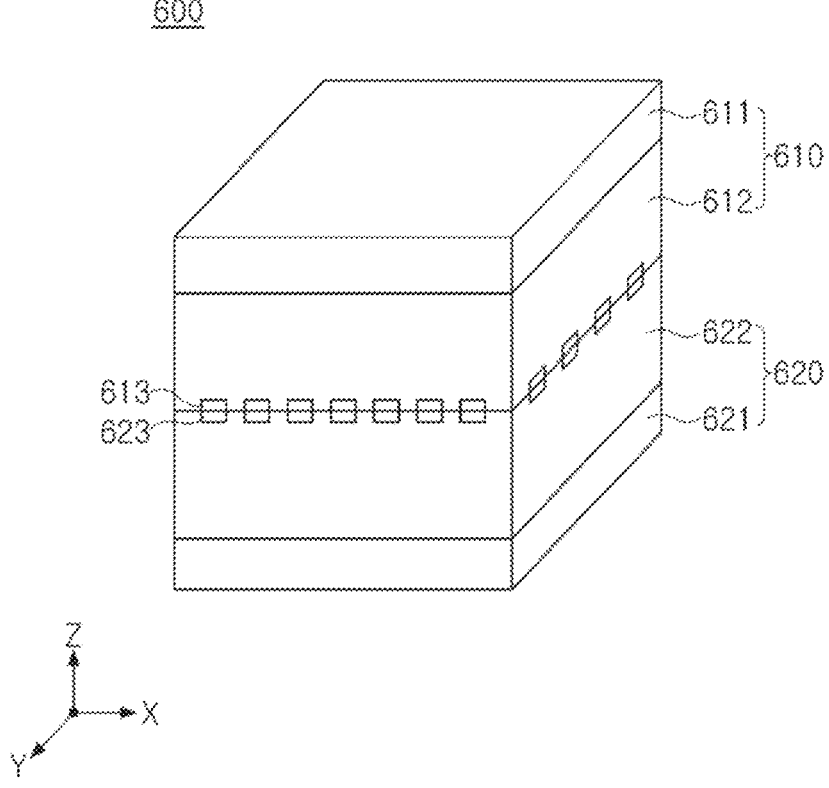
FIG. 19 is a schematic diagram of a semiconductor device according to example embodiments.
Figure 20:
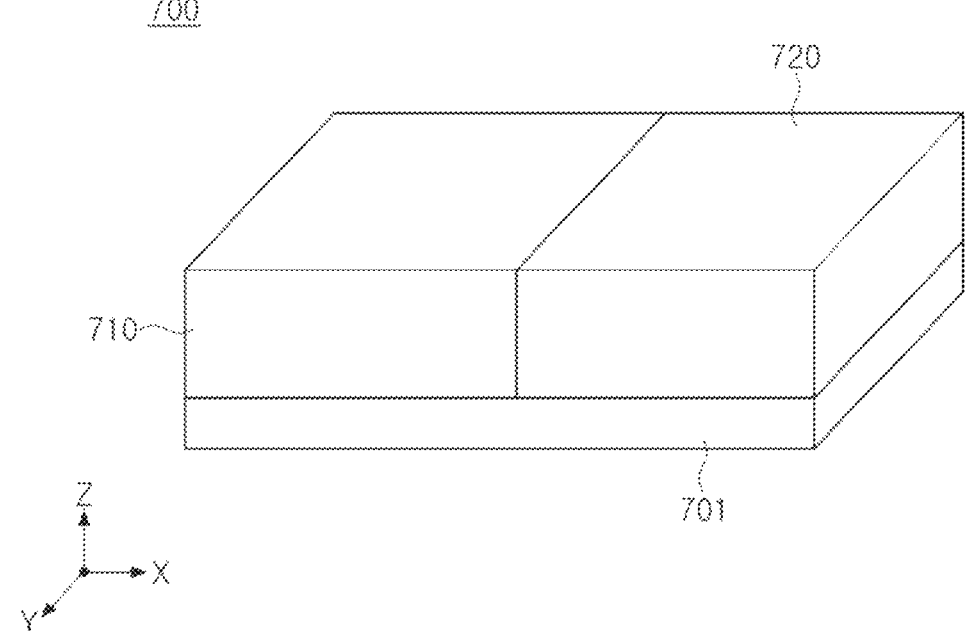
FIG. 20 is a schematic diagram of a semiconductor device according to example embodiments.

FIGS. 18 to 20 are schematic diagrams of a semiconductor device according to example embodiments.

Referring first to FIG. 18, the semiconductor device 500 may include a cell area 510 and a peripheral circuit area 520. The cell area 510 may include a first substrate 511 parallel to a plane defined by a first direction (X-axis direction) and a second direction (Y-axis direction), a cell array area 512 disposed on the first substrate 511, and the like. For example, in the cell array area 512, a plurality of memory cells may be arranged in a memory cell array along the first, second, and third directions (Z-axis direction).

Meanwhile, the peripheral circuit area 520 may include a second substrate 521, an element area 522 disposed on the second substrate 521, and the like. The element area 522 may include a plurality of devices formed on the second substrate 521, a plurality of interconnection patterns connecting the plurality of devices, and a lower interlayer insulating layer covering the plurality of devices and the plurality of interconnection patterns. The upper surface of the lower interlayer insulating layer may contact the lower surface of the first substrate 511.

The cell area 510 and the peripheral circuit area 520 may be stacked on each other in a third direction. For example, a plurality of bit lines, a plurality of gate electrode layers, and a plurality of source lines connected to the memory cells in the cell area 510 may be connected to at least some of the interconnection patterns of the element area 520 through via structures penetrating the first substrate 511. For example, the element area 520 may provide a word line driver, a bit line driver, a sense amplifier circuit, a source line driver, and the like. Depending on example embodiments, the sense amplifier circuit may provide an analog-to-digital converter along with an encoder. Depending on example embodiments, the element area 520 may provide a logic circuit that controls the operation of the semiconductor device 500, a buffer storing information necessary for controlling the semiconductor device 500, and the like.

Next, referring to FIG. 19, the semiconductor device 600 includes a cell area 610 and a peripheral circuit area 620, and the cell area 610 and the peripheral circuit area 620 may be stacked on each other in the third direction (Z-axis direction). The cell area 610 may include a first substrate 611, a cell array area 612 in which memory cells are disposed, and the like, and the peripheral circuit area 620 may include a second substrate 621, an element area 622, and the like. The peripheral circuit area 620 may include a word line driver, bit line driver, source line driver, sense amplifier circuit, and the like.

In an example embodiment illustrated in FIG. 19, upper pads 613 connected to a plurality of bit lines, a plurality of source lines, and a plurality of gate electrode layers in the cell array area 612 may be directly connected to the lower pads 623 that are connected to the interconnection patterns in the element area 622. For example, the upper pads 613 and lower pads 623 may be connected to each other using Cu-to-Cu bonding and may be attached to each other at the chip level or wafer level.

In an example embodiment illustrated in FIG. 20, both the cell area 710 and the peripheral circuit area 720 may be formed on one substrate 701 in the semiconductor device 700. In FIG. 20, the peripheral circuit area 720 is illustrated as being disposed on one side of the cell area 710 in the first direction (X-axis direction), but depending on example embodiments, the arrangement of the cell area 710 and the peripheral circuit area 720 may be modified in various manners. For example, assuming that a plurality of bit lines extend in a first direction and the gate electrode layers extend in a second direction (Y-axis direction), the sense amplifier circuit included in the peripheral circuit area 720 may be disposed in an area adjacent to the cell area 710 in the first direction. On the other hand, the row decoder connected to the gate electrode layers may be disposed in an area adjacent to the cell area 710 in the second direction.

Figure 21:
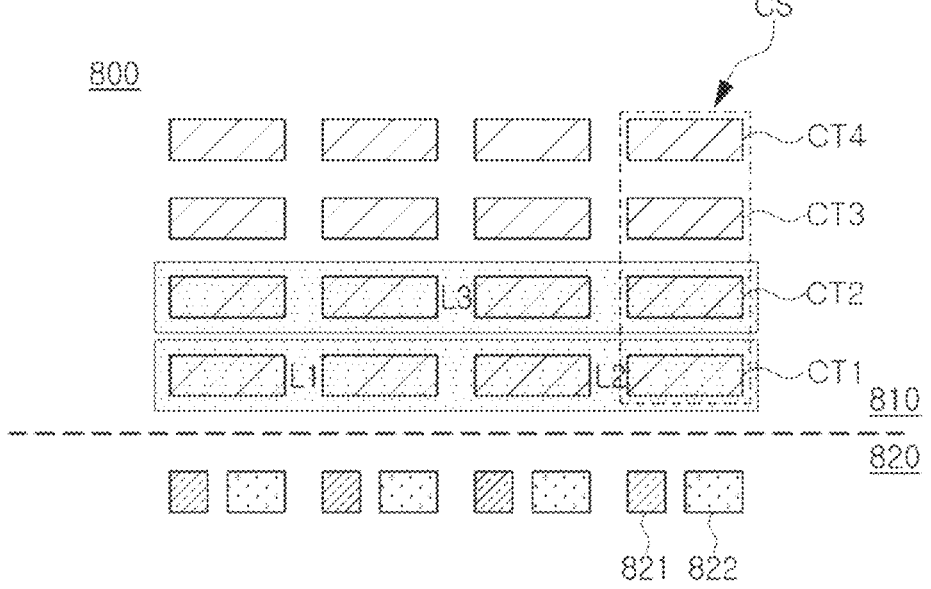
FIG. 21 is a diagram provided to illustrate the operation of a semiconductor device according to example embodiments.

FIG. 21 is a diagram provided to illustrate the operation of a semiconductor device according to example embodiments.

Referring to FIG. 21, a semiconductor device 800 according to example embodiments includes a cell area 810 and a peripheral circuit area 820, and the cell area 810 and the peripheral circuit area 820 may be stacked on each other in one direction. A plurality of cell tiles CT1 to CT4 may be disposed in the cell area 810. Each of the plurality of cell tiles CT1 to CT4 includes a plurality of memory cells arranged in a three-dimensional array, and the cell tiles CT1 to CT4 may be stacked on each other to provide a stack structure SC. The number of the plurality of cell tiles CT1 to CT4 stacked may vary depending on example embodiments. A plurality of memory cells included in each of the plurality of cell tiles CT1 to CT4 may be arranged in a single-layer horizontal structure.

Weights included in the neural network may be stored in memory cells of each of the plurality of cell tiles CT1 to CT4. For example, each of the weights included in the neural network may be converted into weight data of 2 bits or more and stored in memory cells. The neural network includes a plurality of layers L1 to L3, and weights corresponding to the plurality of layers L1 to L3 may be stored in memory cells.

In example embodiments, weights corresponding to one layer may be stored in cell tiles CT1 to CT4 arranged at the same height in the cell area 810. Referring to FIG. 21, the weights corresponding to the first layer L1 are stored in some of the first cell tiles CT1 arranged on the first layer at the first height, and weights corresponding to the second layer L2 may be stored in another part of the first cell tiles CT1. Meanwhile, weights corresponding to the third layer L3 may be stored in at least some of the second cell tiles CT2 arranged on the second layer at the third height. Weights corresponding to two or more layers may be stored in cell tiles disposed on one level, but the weights corresponding to one layer may not be stored dividedly in cell tiles disposed on two or more levels.

Circuits for controlling the cell tiles CT1 to CT4 may be disposed in the peripheral circuit area 820. As an example, to perform an inference operation using weights corresponding to the first to third layers L1 to L3, circuits such as the analog-to-digital converter 821 and the adder tree 822 may be placed in the peripheral circuit area 820.

The analog-to-digital converter 821 may include a sense amplifier and an encoder. The sense amplifier may be connected to the memory cells included in each of the cell tiles CT1 to CT4 through a bit line or source line, and may generate output signals by comparing the current output to the bit line or source line with a plurality of reference currents. An encoder may generate a digital signal using output signals. The adder tree 822 may sum the digital signals output from the analog-to-digital converter 821 and perform inference operations based on a neural network.

Figure 22:
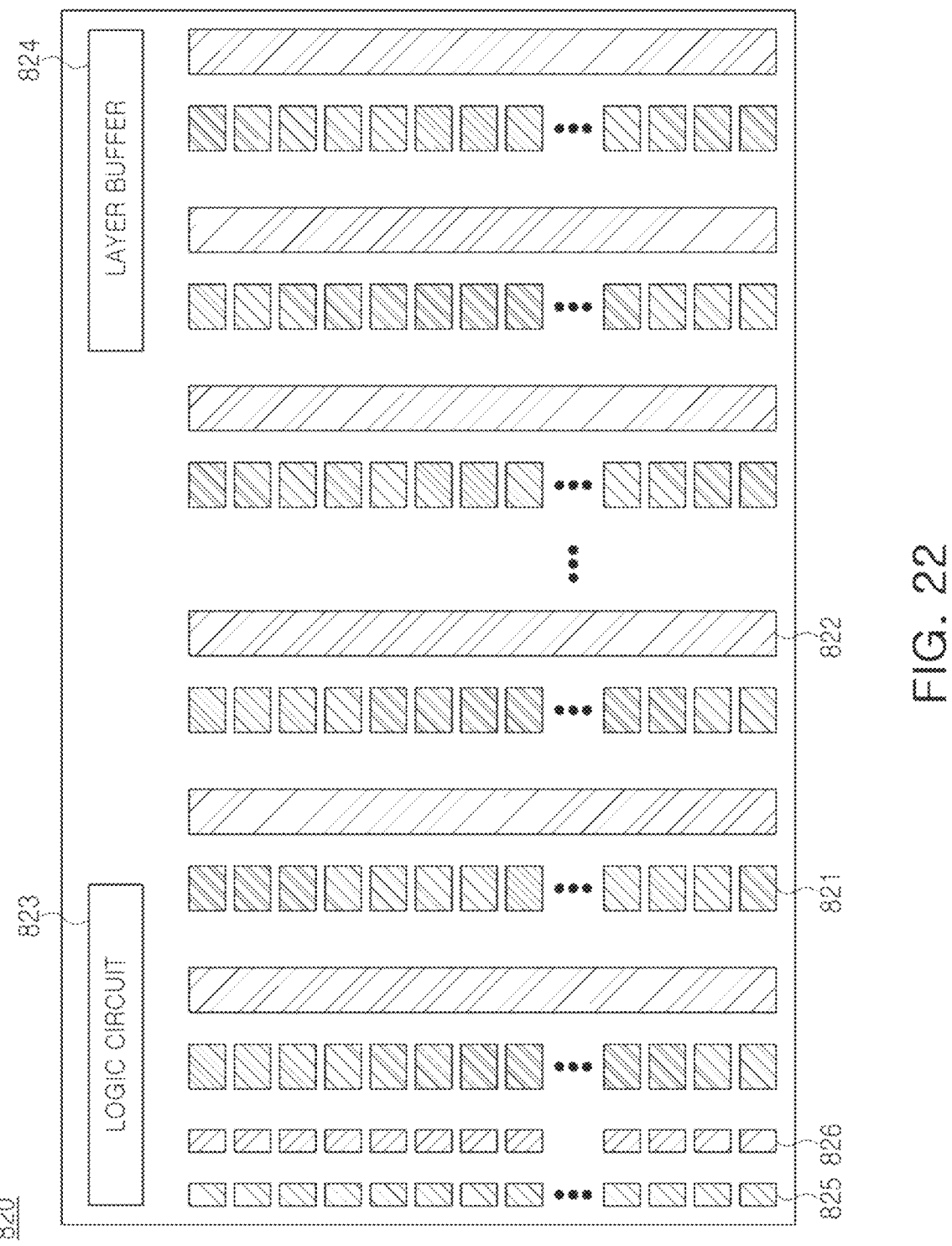
FIG. 22 is a diagram simply illustrating a peripheral circuit area included in a semiconductor device according to example embodiments.
Figure 23:
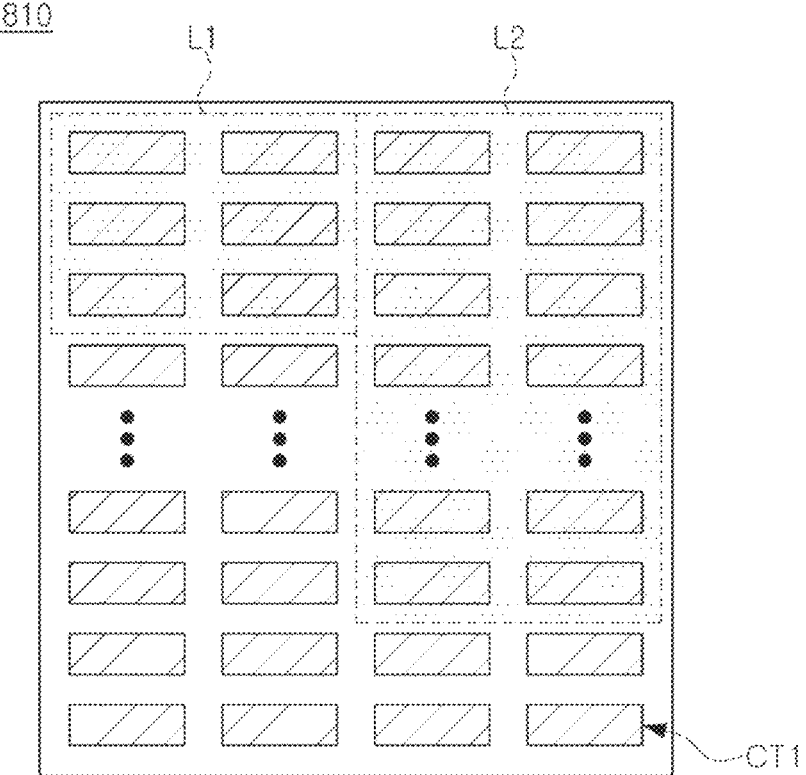
FIG. 23 is a schematic diagram illustrating cell areas included in a semiconductor device according to example embodiments.
Figure 24:
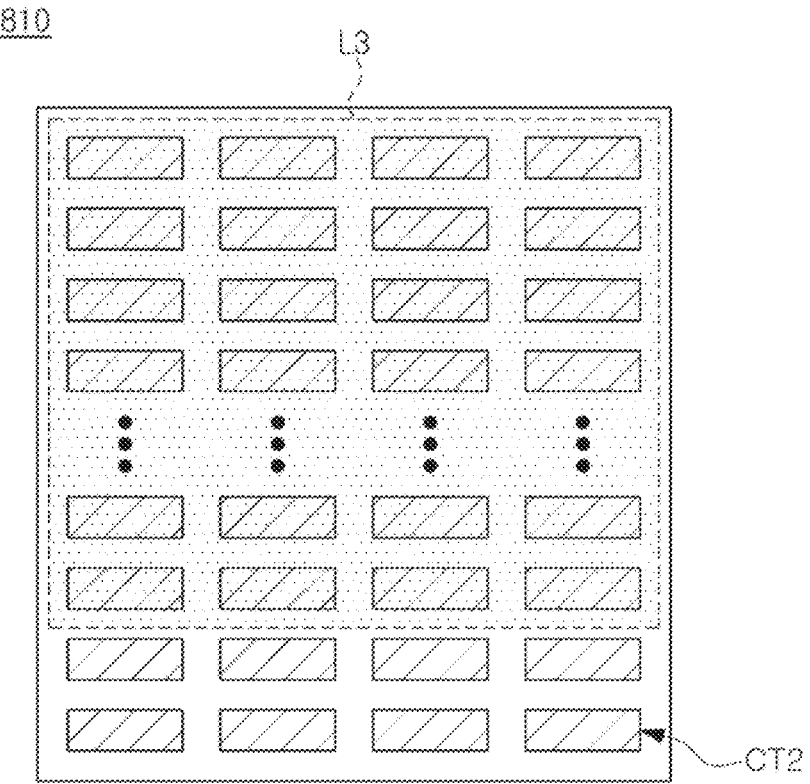
FIG. 24 is a schematic diagram illustrating cell areas included in a semiconductor device according to example embodiments.

FIG. 22 is a diagram simply illustrating a peripheral circuit area included in a semiconductor device according to example embodiments. FIGS. 23 and 24 are diagrams simply illustrating cell areas included in a semiconductor device according to example embodiments.

The peripheral circuit area 820 described with reference to FIG. 22 and the cell area 810 described with reference to FIGS. 23 and 24 may be included in one semiconductor device 800 as previously described with reference to FIG. 21. First, referring to FIG. 22, the peripheral circuit area 820 may include an analog-to-digital converter 821, an adder tree 822, a logic circuit 823, a layer buffer 824, an input buffer 825, an activation circuit 826, and the like.

The analog-to-digital converter 821 and the adder tree 822 may be connected to memory cells arranged in the cell area 810 through bit lines and/or source lines. The analog-to-digital converter 821 includes a sense amplifier and an encoder, and may convert the output current of each bit line into a digital signal and transmit the signal to the adder tree

822. The adder tree 822 may sum the digital signals output from the analog-to-digital converter 821.

The input buffer 825 may temporarily store input data to be transmitted to the next layer when the MAC operation corresponding to one of the layers of the neural network is completed. Input data stored in the input buffer 825 may be input through the activation circuit 826 and through word lines into memory cells where the weights of the next layer are stored.

The logic circuit 823 controls the operation of the peripheral circuit area 820 and may execute program operation to store the weights included in the neural network in the cell area 810, inference operation of the neural network using the weights stored in the cell area 810, and the like. The layer buffer 824 may store mapping information of weights stored in memory cells arranged in a three-dimensional cell array in the cell area 810.

FIG. 23 may be a diagram illustrating a plurality of first cell tiles CT1 disposed on the first layer of the cell area 810. Referring to FIG. 23, weights corresponding to the first layer L1 of the neural network may be stored in some of the first cell tiles CT1 arranged in a 3×2 matrix form from the upper left. Additionally, weights corresponding to the second layer L2 of the neural network may be stored in some other first cell tiles CT1.

FIG. 24 may be a diagram illustrating a plurality of second cell tiles CT2 disposed on the second layer of the cell area 820. Referring to FIG. 24, weights corresponding to the third layer L3 of the neural network may be stored in some of the second cell tiles CT2.

When the inference calculation based on the neural network begins, the logic circuit 823 in the peripheral circuit area 820 may first store the first input data output from the input layer in the input buffer 825, and may input first input data to some of the first cell tiles CT1 in which the weights of the first layer L1 are stored. As described above, input data may be input by 1 bit from some of the first cell tiles CT1 to word lines connected to memory cells. The output current of some of the first cell tiles CT1 in which the weights of the first layer L1 are stored is converted into a digital signal in the analog-to-digital converter 821, and data for which the MAC operation has been completed in the adder tree 822 may be stored in the input buffer 825 as second input data.

Next, the logic circuit 823 may input second input data to some of the other first cell tiles CT1 in which the weights of the second layer L2 are stored. The output current of some other cell tiles CT1 is converted into a digital signal in the analog-to-digital converter 821, and when the MAC operation is completed in the adder tree 822, third input data may be stored in the input buffer 825. The logic circuit 823 may input third input data to some of the second cell tiles CT2 where the weights of the third layer L3 are stored.

To perform the above inference operation, the logic circuit 823 needs to know mapping information in which the weights included in the neural network are stored in a plurality of cell tiles. In example embodiments, mapping information is stored in the layer buffer 824, and the logic circuit 823 may perform an inference operation by referring to the mapping information of the layer buffer 824. The layer buffer 824 may be implemented as non-volatile memory, and depending on example embodiments, the logic circuit 823 may receive mapping information from an external memory controller, and the like, and perform an inference operation without the layer buffer 824.

21

TABLE 2

| Layer | Level | ROW_START | ROW_STOP | COL_START | COL_STOP |
|---|---|---|---|---|---|
| 1 | 1 | 1 | 3 | 1 | 2 |
| 2 | 1 | 1 | 10 | 3 | 4 |
| 3 | 2 | 1 | 12 | 1 | 4 |

For example, mapping information in an example embodiment described with reference to FIGS. 23 and 24 may be as illustrated in Table 2 above. In Table 2 above, the layers correspond to layers included in the neural network, and the level may indicate the height at which cell tiles are located in the cell area. ROW_START and ROW_STOP may refer to the start row and last row of cell tiles in one level layer in which the weights of the corresponding layer are stored, and COL_START and COL_STOP may indicate the start and last columns of cell tiles in one level layer in which the weights of the corresponding layer are stored.

In example embodiments, weights corresponding to one layer may be distributed and stored in cell tiles disposed on one level. Therefore, when performing an inference operation using the weights stored in the memory cells of the cell tiles, power consumption may be reduced by reducing the size of the current output to the analog-to-digital converter 821. Additionally, the analog-to-digital converter 821 may be implemented with devices with low current driving capability, thereby improving the integration of the semiconductor device.

As set forth above, according to example embodiments, a semiconductor device includes memory cells disposed in three dimensions, and weights corresponding to each of the layers included in a neural network may be stored in memory cells disposed at the same height from the upper surface of a substrate. Therefore, by reducing the amount of current output from memory cells in the process of executing inference operations or the like, the degree of integration of the semiconductor device may be improved and power consumption may be reduced.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
a cell area in which a plurality of memory cells arranged in a first direction, a second direction and a third direction are disposed, the first direction and the second direction being parallel to an upper surface of a substrate and intersecting, and the third direction being perpendicular to the upper surface of the substrate; and
a peripheral circuit area in which a word line driver connected to the plurality of memory cells through a plurality of word lines, a sense amplifier circuit connected to the plurality of memory cells through a plurality of bit lines, and a source line driver connected to the plurality of memory cells through a plurality of source lines, are disposed,
wherein the peripheral circuit area is configured to:
store weights corresponding to one layer among a plurality of layers in a neural network, in a portion of memory cells disposed at a same height in the third direction among the plurality of memory cells, and
store weight data corresponding to one weight among the weights in two or more memory cells disposed at a same height in the third direction and aligned in the first direction or the second direction.

2. The semiconductor device of claim 1,
wherein the weight data corresponding to the one weight is n-bit data, where n is a natural number of 2 or more, and a number of the two or more memory cells is n, and
wherein the peripheral circuit area is configured to store the n-bit data as separate bits in the two or more memory cells, respectively.

3. The semiconductor device of claim 1, wherein in an inference operation based on the neural network, the peripheral circuit area is configured to sequentially apply input voltages corresponding to bits of input data to be calculated with the weights to the plurality of word lines.

4. The semiconductor device of claim 3, wherein the peripheral circuit area is configured to apply one input voltage to the plurality of word lines simultaneously.

5. The semiconductor device of claim 1,
wherein the cell area further comprises a plurality of reference cells, and the plurality of reference cells are connected to a plurality of reference word lines, a plurality of reference source lines, and a plurality of reference bit lines, and
wherein the peripheral circuit area is configured to activate all of the plurality of reference word lines and obtain a plurality of reference currents through the plurality of reference bit lines.

6. The semiconductor device of claim 5, wherein the peripheral circuit area further comprises a selection circuit connected between the plurality of reference bit lines and the sense amplifier circuit.

7. The semiconductor device of claim 6, wherein the sense amplifier circuit comprises a plurality of sense amplifiers, and a number of the plurality of sense amplifiers is equal to a number of the plurality of bit lines.

8. The semiconductor device of claim 7,
wherein the selection circuit is configured to sequentially connect the plurality of reference bit lines to input terminals of the plurality of sense amplifiers, and
wherein while the word line driver is configured to drive the plurality of word lines, the plurality of sense amplifiers are configured to sequentially compare bit line currents output by the plurality of bit lines with the plurality of reference currents.

9. The semiconductor device of claim 7, wherein a number of the plurality of sense amplifiers is greater than a number of the plurality of bit lines.

10. The semiconductor device of claim 9,
wherein the plurality of bit lines is commonly connected to a first sense amplifier and a second sense amplifier among the plurality of sense amplifiers, and
wherein the first sense amplifier is configured to receive a first reference current among the plurality of reference currents, and the second sense amplifier is configured to receive a second reference current different from the first reference current among the plurality of reference currents.

11. The semiconductor device of claim 1, wherein the cell area and the peripheral circuit area are stacked in the third direction.

12. A semiconductor device comprising:
a cell area in which a plurality of memory cells are arranged in a first direction, a second direction and a third direction, the first direction and the second direction being parallel to an upper surface of a substrate and intersecting and the third direction being perpendicular to the upper surface of the substrate, the plurality of memory cells comprising a first active area and a second active area aligned in the first direction, a channel layer connected to the first active area and the second active area in the first direction, and a ferro-electric layer and a gate electrode layer surrounding the channel layer; and a peripheral circuit area in which a plurality of sense amplifiers are connected to the plurality of memory cells through a plurality of bit lines, a word line driver connected to the plurality of memory cells through a plurality of word lines, and a source line driver connected to the plurality of memory cells through a plurality of source lines are disposed, wherein the peripheral circuit area is configured to store weight data corresponding to one weight among weights in a neural network, in two or more memory cells aligned continuously in the first direction or the second direction and located on a same height in the third direction, as separate bits.

13. The semiconductor device of claim 12, wherein the peripheral circuit area is configured to control the source line driver to apply a common voltage to the plurality of source lines while executing an inference operation based on the neural network.

14. The semiconductor device of claim 12, wherein the peripheral circuit area is configured to activate selective word lines among the plurality of word lines while executing an inference operation based on the neural network, and wherein the selective word lines are connected to some memory cells located on a same height in the third direction.

15. The semiconductor device of claim 12, wherein the neural network comprises a first layer, a second layer and a third layer connected by connection paths to which the weights are assigned, and wherein the peripheral circuit area is configured to store, of the weights, weights assigned to connection paths between the first layer and the second layer among a plurality of layers in some memory cells disposed at a first height in the third direction, and weights assigned to connection paths between the second layer and the third layer among the plurality of layers in some other memory cells disposed at a second height different from the first height in the third direction.

16. The semiconductor device of claim 12, wherein in a program operation of storing the weight data as separate bits in the two or more memory cells, the source line driver is configured to input a reference voltage to a source line of the plurality of source lines connected to the two or more memory cells, the sense amplifier is configured to input a selection voltage to a bit line of the plurality of bit lines connected to the two or more memory cells, and the word line driver is configured to input a first program voltage or a second program voltage greater than the first program voltage to a word line of the plurality of word lines connected to the two or more memory cells.

17. The semiconductor device of claim 16, wherein the first program voltage is less than the reference voltage, and the second program voltage is greater than the reference voltage.

18. The semiconductor device of claim 16, wherein the word line driver is configured to input the first program voltage or the second program voltage to the word line connected to the two or more memory cells and simultaneously and individually program the two or more memory cells.

19. A semiconductor device comprising:

a cell area comprising a plurality of memory cells arranged in three dimensions on a substrate; and a peripheral circuit area configured to store weight data corresponding to weights in a neural network in the plurality of memory cells and execute an inference operation based on the neural network using the weight data stored in the plurality of memory cells, wherein in the inference operation, the peripheral circuit area is configured to simultaneously activate a portion of memory cells disposed at a same height from the substrate, among the plurality of memory cells, and deactivate remaining memory cells disposed at a different height from the portion of memory cells.

20. The semiconductor device of claim 19, wherein the peripheral circuit area is configured to store among the weights, some weights corresponding to one of layers of the neural network in two or more memory cells disposed at a same height among the plurality of memory cells.

* * * * *